(12) United States Patent
Yamada

(10) Patent No.: US 9,412,783 B2
(45) Date of Patent: Aug. 9, 2016

(54) IMAGE PICKUP UNIT AND IMAGE PICKUP DISPLAY SYSTEM

(71) Applicant: Sony Corporation, Tokyo (JP)

(72) Inventor: Yasuhiro Yamada, Kanagawa (JP)

(73) Assignee: Sony Corporation, Tokyo (JP)

(*) Notice: Subject to any disclaimer, the term of this patent is extended or adjusted under 35 U.S.C. 154(b) by 323 days.

(21) Appl. No.: 14/220,769

(22) Filed: Mar. 20, 2014

(65) Prior Publication Data

US 2014/0291483 A1 Oct. 2, 2014

(30) Foreign Application Priority Data

Mar. 28, 2013 (JP) .................................. 2013-068636

(51) Int. Cl.
| | |
|---|---|
| *H01L 27/146* | (2006.01) |
| *H04N 5/32* | (2006.01) |
| *H04N 5/359* | (2011.01) |
| *H04N 5/374* | (2011.01) |

(52) U.S. Cl.
CPC ............ *H01L 27/14658* (2013.01); *H04N 5/32* (2013.01); *H04N 5/359* (2013.01); *H04N 5/374* (2013.01)

(58) Field of Classification Search
USPC ................. 250/208.1, 214 R, 214.1, 214 SW; 348/272–283, 294–324, 332, 333.08, 348/335–338; 257/291–294, 414, 431–466; 438/57, 59–98, 144
See application file for complete search history.

(56) References Cited

U.S. PATENT DOCUMENTS

| | | | | |
|---|---|---|---|---|
| 6,423,958 B1* | 7/2002 | Okamoto | .......... | H01L 27/14643 250/208.1 |
| 7,286,174 B1* | 10/2007 | Weale | .................... | H04N 5/335 250/208.1 |
| 2012/0051118 A1* | 3/2012 | Yamazaki | .............. | G11C 16/02 365/149 |

FOREIGN PATENT DOCUMENTS

JP          2011-135561          7/2011

* cited by examiner

*Primary Examiner* — Pascal M Bui Pho
(74) *Attorney, Agent, or Firm* — Chip Law Group

(57) ABSTRACT

An image pickup unit includes: an image pickup section including a plurality of pixels each including a photoelectric conversion device and a field effect transistor; a drive section configured to control a voltage to be applied to the transistor to perform reading-out driving of a signal charge accumulated in the pixel; and a correction section configured to correct a voltage value used to drive the transistor, the transistor including first and second gate electrodes arranged to face each other with a semiconductor layer interposed in between, the drive section being configured to perform ON/OFF control of the transistor by applying first and second voltages to the first and second gate electrodes of the transistor, respectively, and the correction section being configured to correct a voltage value of one or both of the first and second voltages in accordance with a shift amount of a threshold voltage of the transistor.

15 Claims, 22 Drawing Sheets

IMAGE PICKUP UNIT AND IMAGE PICKUP DISPLAY SYSTEM

CROSS REFERENCE TO RELATED APPLICATION

This application claims the benefit of Japanese Priority Patent Application JP 2013-068636 filed on Mar. 28, 2013, the entire contents of each which are incorporated herein by reference.

BACKGROUND

The present disclosure relates to an image pickup unit that includes a photoelectric conversion device and to an image pickup display system that includes such an image pickup unit.

Various types of image pickup units have been proposed as an image pickup unit in which the photoelectric conversion device is built in each pixel (an image pickup pixel). Examples of such an image pickup unit that includes such a photoelectric conversion device may include a so-called optical touch panel and a radiographic image pickup unit (for example, Japanese Unexamined Patent Application Publication No. 2011-135561).

SUMMARY

In such an image pickup unit as described above, a thin film transistor (TFT) is used as a switching device to read out a signal charge from each pixel. However, such a disadvantage may occur that the reliability of the unit is reduced due to shifting of a threshold voltage of the TFT.

It is desirable to provide an image pickup unit that makes is possible to attain high reliability by mitigating adverse influence caused by shifting of the threshold voltage of the transistor, and an image pickup display system that includes such an image pickup unit.

According to an embodiment of the present disclosure, there is provided an image pickup unit, including: an image pickup section including a plurality of pixels, each of the plurality of pixels including a photoelectric conversion device and a field effect transistor; a drive section configured to control a voltage to be applied to the transistor to perform reading-out driving of a signal charge accumulated in the pixel; and a correction section configured to correct a voltage value used to drive the transistor. The transistor includes first and second gate electrodes arranged to face each other with a semiconductor layer interposed in between. The drive section is configured to perform ON/OFF control of the transistor by applying a first voltage to the first gate electrode of the transistor and applying a second voltage to the second gate electrode of the transistor. The correction section is configured to correct a voltage value of one or both of the first and second voltages in accordance with a shift amount of a threshold voltage of the transistor.

According to another embodiment of the present disclosure, there is provided an image pickup display system including: an image pickup unit; and a display configured to perform image display based on an image pickup signal obtained by the image pickup unit. The image pickup unit includes: an image pickup section including a plurality of pixels, each of the plurality of pixels including a photoelectric conversion device and a field effect transistor; a drive section configured to control a voltage to be applied to the transistor to perform reading-out driving of a signal charge accumulated in the pixel; and a correction section configured to correct a voltage value used to drive the transistor. The transistor includes first and second gate electrodes arranged to face each other with a semiconductor layer interposed in between. The drive section is configured to perform ON/OFF control of the transistor by applying a first voltage to the first gate electrode of the transistor and applying a second voltage to the second gate electrode of the transistor. The correction section is configured to correct a voltage value of one or both of the first and second voltages in accordance with a shift amount of a threshold voltage of the transistor.

In the image pickup unit and the image pickup display system according to the above-described embodiments of the present invention, the ON/OFF control of the transistor is performed by applying the first voltage to the first gate electrode of the transistor and the second voltage to the second gate electrode of the transistor when reading out the signal charge. The voltage value of one of the first and second voltages is corrected at a predetermined timing in accordance with the shift amount of the threshold voltage of the transistor.

According to the image pickup unit and the image pickup display system according to the above-described embodiments of the present disclosure, the image pickup section includes the plurality of pixels each including the photoelectric conversion device and the field effect transistor, and the transistor includes the first and second gate electrodes arranged to face each other with the semiconductor layer interposed in between. The drive section performs the ON/OFF control of the transistor by applying the first voltage to the first gate electrode of the transistor so configured and applying the second voltage to the second gate electrode of the transistor, and the correction section corrects the voltage value of one of the first and second voltages in accordance with the shift amount of the threshold voltage. Therefore, it becomes possible to attain high reliability by mitigating the adverse influence caused by shifting of the threshold voltage of the transistor.

It is to be understood that both the foregoing general description and the following detailed description are exemplary, and are intended to provide further explanation of the technology as claimed.

BRIEF DESCRIPTION OF THE DRAWINGS

The accompanying drawings are included to provide a further understanding of the disclosure, and are incorporated in and constitute a part of this specification. The drawings illustrate embodiments and, together with the specification, serve to explain the principles of the technology.

DETAILED DESCRIPTION

In the following, an embodiment of the present disclosure will be described in detail with reference to the accompanying drawings. It is to be noted that description will be made in the following order.

1. Embodiment (an example of an image pickup unit that reads out a signal while applying a bias voltage to one of two gate electrodes and corrects the bias voltage in accordance with a shift amount of a threshold voltage)
2. Modification Example 1 (an example that the gate electrode to which the bias voltage is to be applied is temporarily switched to a floating state)
3. Modification Example 2 (an example that the gate electrode to which the bias voltage is to be applied is temporarily switched so as to have the same potential as the other gate electrode)
4. Modification Example 3 (another example of a passive pixel circuit)
5. Modification Example 4 (still another example of the passive pixel circuit)
6. Modification Examples 5 and 6 (examples of an active pixel circuit)
7. Modification Examples 7 and 8 (examples of an image pickup section that picks up an image on the basis of radiation)
8. Application Example (an application example to an image pickup display system)

Embodiment

General Configuration of Image Pickup Unit 1

Figure 1:
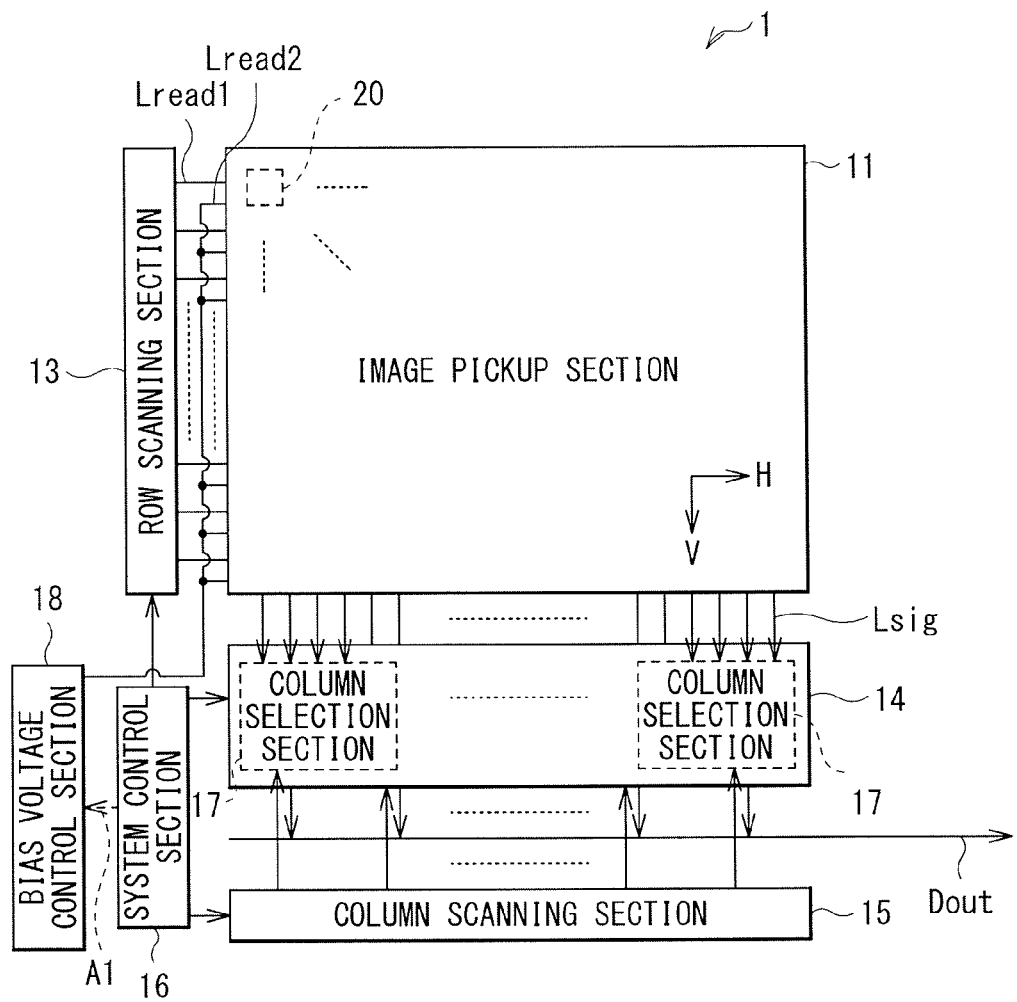
FIG. 1 is a block diagram illustrating a general configuration example of an image pickup unit according to an embodiment of the present disclosure.

FIG. 1 illustrates a general block configuration of an image pickup unit (an image pickup unit 1) according to an embodiment of the present disclosure. The image pickup unit 1 may read out information of an object (picks up an image of the object) on the basis of incident light (image pickup light) such as, for example, later described radiation and so forth. The image pickup unit 1 includes an image pickup section 11, a row scanning section 13, an A/D conversion section 14, a column scanning section 15, a system control section 16, and a bias voltage control section 18. In the above-mentioned sections, the row scanning section 13, the A/D conversion section 14, the column scanning section 15, the system control section 16, and the bias voltage control section 18 correspond to specific examples of "drive section" in the embodiment of the present disclosure, and the bias voltage control section 18 corresponds to a specific example of "correction section" in the embodiment of the present disclosure.

(Image Pickup Section 11)

The image pickup section 11 generates an electric signal in accordance with the incident light (the image pickup light). In the image pickup section 11, pixels (image pickup pixels, or unit pixels) 20 are arranged two-dimensionally in a row by column form (in a matrix) and each pixel 20 includes a photoelectric conversion device (a later-described photoelectric conversion device 21) that generates photocharges of a charge amount according to a light amount of the image pickup light and accumulates the generated photocharges therein. It is to be noted that, in the following, description will be made by referring to a horizontal direction (a row direction) as an "H" direction and referring to a vertical direction (a column direction) as a "V" direction in the image pickup section 11 as illustrated in FIG. 1.

Figure 2:
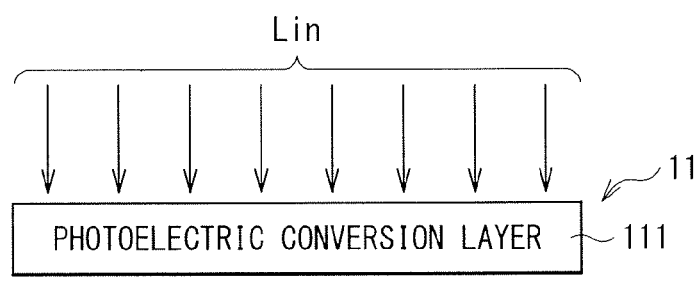
FIG. 2 is a schematic diagram illustrating a schematic configuration example of an image pickup section illustrated in FIG. 1.

FIG. 2 illustrates a schematic configuration example of the image pickup section 11. The image pickup section 11 includes a photoelectric conversion layer 111 in which the photoelectric conversion device 21 is arranged for each pixel 20. The photoelectric conversion layer 111 is configured such that photoelectric conversion (conversion from image pickup light Lin into a signal charge) based on the incident image pickup light Lin is performed as illustrated in FIG. 2.

Figure 3:
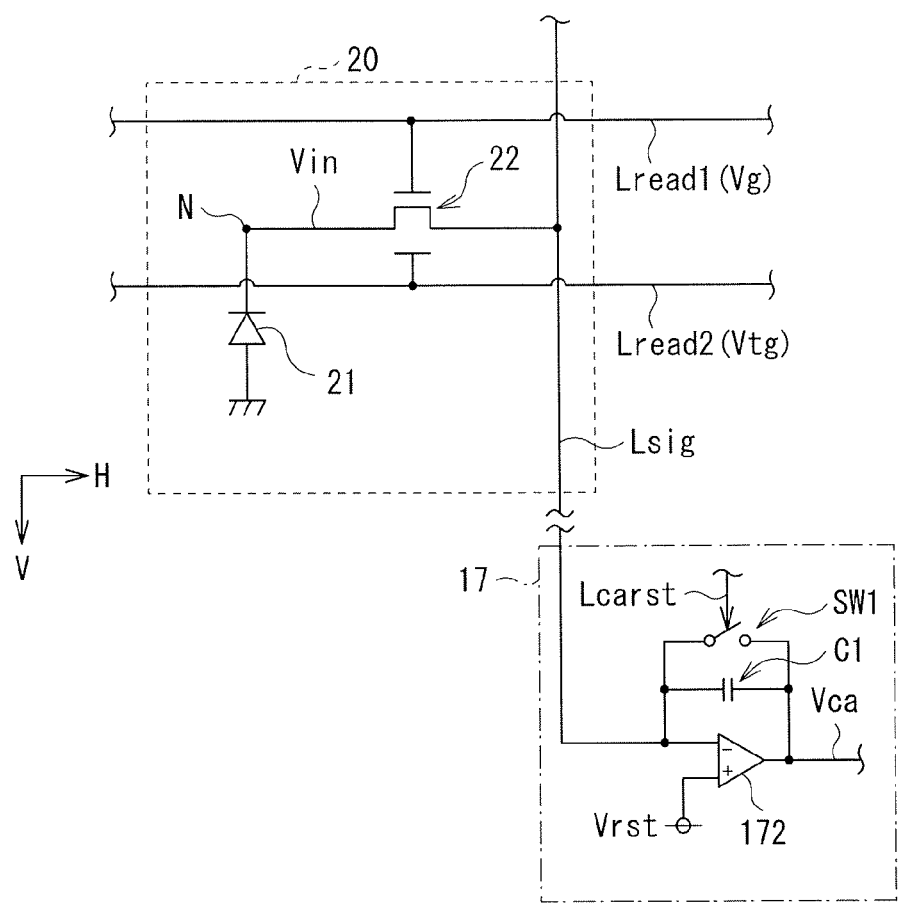
FIG. 3 is a circuit diagram illustrating a detailed configuration example of a pixel and so forth illustrated in FIG. 1.

FIG. 3 is a diagram illustrating a circuit configuration (a so-called passive circuit configuration) example of the pixel 20 together with a circuit configuration example of a later-described column selection section 17 in the A/D conversion section 14. The passive-type pixel 20 includes one photoelectric conversion device 21 and one transistor 22. In addition, read-out control lines (later-described two read-out control lines Lread1 and Lread2) that extend in the H direction and a signal line Lsig that extends in the V direction are connected to the pixel 20.

The photoelectric conversion device 21 may be configured of, for example, a PIN (Positive Intrinsic Negative) type photodiode or a MIS (Metal-Insulator-Semiconductor) type sensor so as to generate the signal charges of the charge amount according to the light amount of the incident light (the image pickup light Lin) as described above. It is to be noted that a cathode of the photoelectric conversion device 21 is connected to an accumulation node N in this example.

The transistor 22 is a transistor (a read-out transistor) that is turned on in accordance with a row scanning signal supplied from each of the read-out control lines (Lread1 and Lread2) to output a signal charge (an input voltage Vin) obtained by the photoelectric conversion device 21 to the signal line Lsig. In this example, the transistor 22 is configured of an N-channel type (N-type) field effect transistor (FET). Alternatively, the transistor 22 may be configured of a P-channel type (P-type) FET and so forth.

In the present embodiment, the transistor 22 has a so-called dual gate structure that includes two gates (later-described first gate electrode 220A and second gate electrode 220B) that are arranged so as to face each other with a semiconductor layer (a later-described semiconductor layer 226) interposed therebetween.

Figure 4:
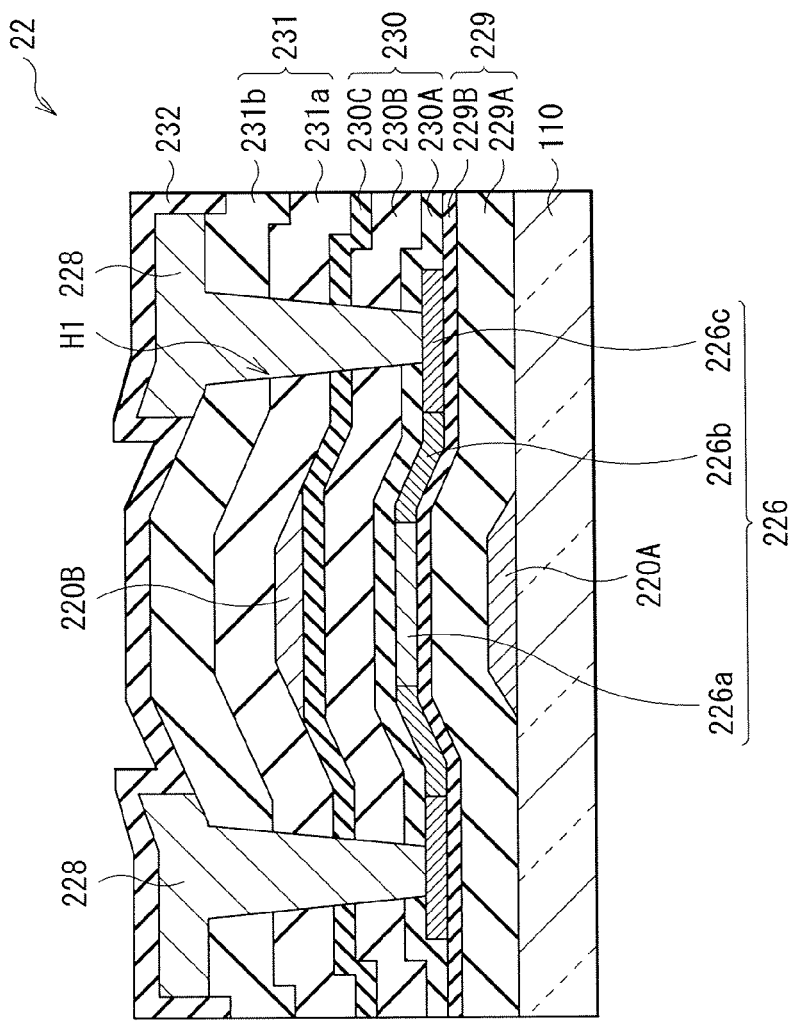
FIG. 4 is a sectional diagram illustrating a schematic configuration example of a transistor illustrated in FIG. 3.

FIG. 4 illustrates a sectional structure of the transistor 22. The transistor 22 includes the first gate electrode 220A (a first gate electrode) and a first gate insulating film 229 formed so as to cover the first gate electrode 220A, on a substrate 110. The semiconductor layer 226 that includes a channel layer (an active layer) 226a, an LDD (Lightly Doped Drain) layer 226b, and an $N^+$ layer 226c is formed on the first gate insulating film 229. A second gate insulating film 230 is formed so as to cover the semiconductor layer 226 and the second gate electrode 220B (a second gate electrode) is disposed in a region, on the second gate insulating film 230, that faces the first gate electrode 220A. A first interlayer insulating film 231 having a contact hole H1 is formed on the second gate electrode 220B and a source-drain electrode 228 is formed so as to fill up the contact hole H1. A second interlayer insulating film 232 is formed on the first interlayer insulating film 231 and the source-drain electrode 228.

The semiconductor layer 226 may be configured of, for example, a silicon-based semiconductor such as non-crystalline silicon (amorphous silicon), microcrystalline silicon, and/or polycrystalline silicon (poly-silicon) and so forth, and may be desirably configured of low temperature polycrystalline silicon (LTPS: Low Temperature Poly-silicon). Alternatively, the semiconductor layer 226 may be configured of an oxide semiconductor such as indium gallium zinc oxide (InGaZnO) and zinc oxide (ZnO). In the semiconductor layer 226, the LDD layer 226b is formed between the channel layer 226a and the $N^+$ layer 226c in order to reduce leak currents. The source-drain electrode 228 functions as a source or a drain and may be configured of a single layer film made of any one of, for example, Ti, Al, Mo, W, Cr and so forth or a laminated film made of the above-mentioned materials.

Each of the first gate electrode 220A and the second gate electrode 220B may be configured of a single layer film made of any of, for example, Ti, Al, Mo, W, Cr, and so forth or a laminated film made of the above-mentioned materials. The first gate electrode 220A and the second gate electrode 220B are disposed so as to face each other with the first gate insulating film 229, the semiconductor layer 226, and the second gate insulating film 230 sandwiched in between as described above.

Each of the first gate insulating film 229 and the second gate insulating film 230 may be a single layer film configured of, for example, a silicon oxide ($SiO_2$) film, a silicon oxynitride (SiON) film, or the like, or may be a laminated film including a silicon compound film such as the above mentioned film and a silicon nitride ($SiN_x$) film. For Example, the first gate insulating film 229 may be configured of a lamination including a silicon nitride film 229A and a silicon oxide film 229B in order from the substrate 110, and the second gate insulating film 230 may be configured of a lamination including a silicon oxide film 230A, a silicon nitride film 230B, and a silicon oxide film 230C in order from the substrate 110. However, when the semiconductor layer 226 is made of low temperature polycrystalline silicon (low temperature poly-silicon), it may be desirable to provide the silicon oxide films (the silicon oxide films 229B and 230A) on surfaces that are in contact with the semiconductor layer 226 (describing in detail, the channel layer 226a) in the first gate insulting film 229 and the second gate insulating film 230 from the viewpoint of manufacturability.

Each of the first interlayer insulating film 231 and the second interlayer insulating film 232 may be configured of a single layer film formed by any of, for example, a silicon oxide film, a silicon nitride film, a silicon oxynitride film, and so forth or of a laminated film formed of the above-mentioned films. For example, the first interlayer insulating film 231 may be configured of a lamination including a silicon oxide film 231a and a silicon nitride film 231b in order from the substrate 110 and the second interlayer insulating film 232 may be configured of a silicon oxide film.

In the present embodiment, for example, the first gate electrode 220A may be connected to the read-out control line Lread1 and the second gate electrode 220B may be connected to the read-out control line Lread2, in the circuit configuration of the pixel 20. In such a configuration, voltages to be applied to the first gate electrode 220A and the second gate electrode 220B are separately controlled. Specifically, the voltage to be applied to the first gate electrode 220A may be controlled by, for example, the system control section 16 and the row scanning section 13, and the voltage to be applied to the second gate electrode 220B may be controlled by, for example, the bias voltage control section 18. Thus, a pulse voltage Vg (a first voltage) corresponding to a row scanning signal is applied to the first gate electrode 220A and a bias voltage Vtg (a second voltage) is applied to the second gate electrode 220B. It is to be noted that, although, in this example, the first gate electrode 220A to which the pulse voltage is to be applied is arranged on a lower side (under the semiconductor layer 266) and the second gate electrode 220B to which the bias voltage is to be applied is arranged on an upper side (above the semiconductor layer 226), a vertically inverted structure may be also possible. The source (the source-drain electrode 228) of the transistor 22 may be connected to, for example, the signal line Lsig, and the drain (the source-drain electrode 228) of the transistor 22 may be connected to, for example, a cathode of the photoelectric conversion device 21 via the accumulation node N. In addition, an anode of the photoelectric conversion device 21 is connected to the ground (earthed) in this example.

(Row Scanning Section 13)

The row scanning section 13 is a pixel drive section (a row scanning circuit) that is configured including later-described shift register circuits, predetermined logic circuits, and so forth performs row-by-row (horizontal-line-by-horizontal-line) driving (line sequential scanning) on the plurality of pixels 20 in the image pickup section 11. Specifically, image picking-up operations such as later-described reading-out operation and resetting operation may be performed by, for example, line sequential scanning. It is to be noted that the line sequential scanning may be performed by supplying the row scanning signal to each pixel 20 via, for example, the read-out control line Lread1.

Figure 5A:
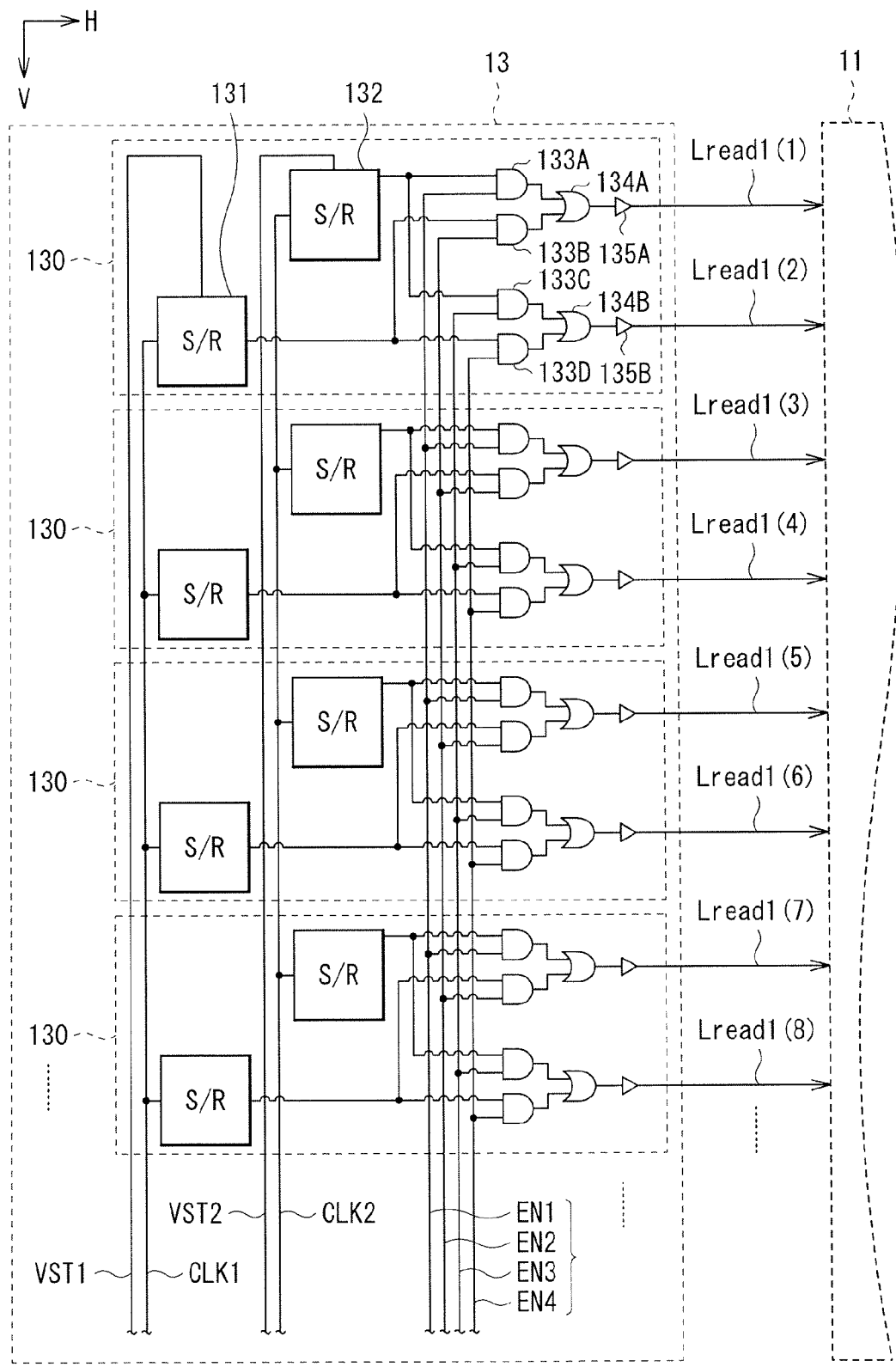
FIG. 5A is a block diagram illustrating a detailed configuration example of a row scanning section illustrated in FIG. 1.

FIG. 5A illustrates a block configuration example of the row scanning section 13. The row scanning section 13 includes a plurality of unit circuits 130 that extend in the V direction. It is to be noted that, in this example, eight read-out control lines Lread1 that are connected to four unit circuits 130 illustrated in the drawing are denoted by Lread1(1) to Lread1(8) from top to bottom.

Each unit circuit 130 may include, for example, one or a plurality of columns (here, two columns) of shift register circuits 131 and 132 (abbreviated to "SIR" in the block in the drawing for convenience; the same shall apply hereinafter), four AND circuits (logical product circuits) 133A to 133D, two OR circuits (logical sum circuits) 134A and 134B, and two buffer circuits 135A and 135B. Although a configuration that includes two columns of the shift register circuits will be described as an example here, the unit circuit may be configured of one column of the shift register circuits. However, although not described in detail, it becomes possible to perform the resetting operation a plurality of times in one frame period by providing two or more columns of the shift register circuits.

The shift register circuit 131 is a circuit that generates pulse signals sequentially shifting in the plurality of unit circuits 130 as a whole in the V direction on the basis of a start pulse VST1 and a clock signal CLK1 supplied from the system control section 16. Likewise, the shift register circuit 132 is a circuit that generates pulse signals sequentially shifting in the plurality of unit circuits 130 as a whole in the V direction on the basis of a start pulse VST2 and a clock signal CLK2 supplied from the system control section 16. Thus, for example, the shift register circuit 131 may generate the pulse signal for first reset driving and the shift register circuit 132 may generate the pulse signal for second reset driving.

Four types of enable signals EN1 to EN4 for controlling (defining) valid periods of the respective pulse signals (respective output signals) output from the shift register circuits 131 and 132 are input to the AND circuits 133A to 133D, respectively. Specifically, the pulse signal from the shift register circuit 132 is input to one input terminal and the enable signal EN1 is input to the other input terminal in the AND circuit 133A. The pulse signal from the shift register circuit 131 is input to one input terminal and the enable signal EN2 is input to the other input terminal in the AND circuit 133B. The pulse signal from the shift register circuit 132 is input to one input terminal and the enable signal EN3 is input to the other input terminal in the AND circuit 133C. The pulse signal from the shift register circuit 131 is input to one input terminal and the enable signal EN4 is input to the other input terminal in the AND circuit 133D.

The OR circuit 134A is a circuit that generates a logical sum signal (an OR signal) of an output signal from the AND circuit 133A and an output signal from the AND circuit 133B. Likewise, the OR circuit 134B is a circuit that generates a logical sum signal of an output signal from the AND circuit 133C and an output signal from the AND circuit 133D. The logical sum signals of the output signals (the pulse signals) output from the shift register circuits 131 and 132 are generated by the above-mentioned AND circuits 133A to 133D and the OR circuits 134A and 134B, respectively, in this way while controlling the valid periods of the respective output signals. Thus, respective driving timings and so forth at the time when later-described reset driving is to be performed a plurality of times are defined.

The buffer circuit 135A is a circuit that serves as a buffer for the output signal (the pulse signal) from the OR circuit 134A, and the buffer circuit 135B is a circuit that serves as a buffer for the output signal from the OR circuit 134B. The pulse signals (the row scanning signals) after being buffered by the buffer circuits 135A and 135B are output to the respective pixels 20 in the image pickup section 11 via the read-out control lines Lread1.

(A/D Conversion Section 14)

The A/D conversion section 14 includes the plurality of column selection sections 17 that are provided one for every plurality of (here, four) signal lines Lsig, and performs A/D conversion (analog/digital conversion) on the basis of a signal voltage (a signal charge) input via the signal line Lsig. Thus, output data Dout (an image pickup signal) configured of a digital signal is generated and output to the outside.

Figure 5B:
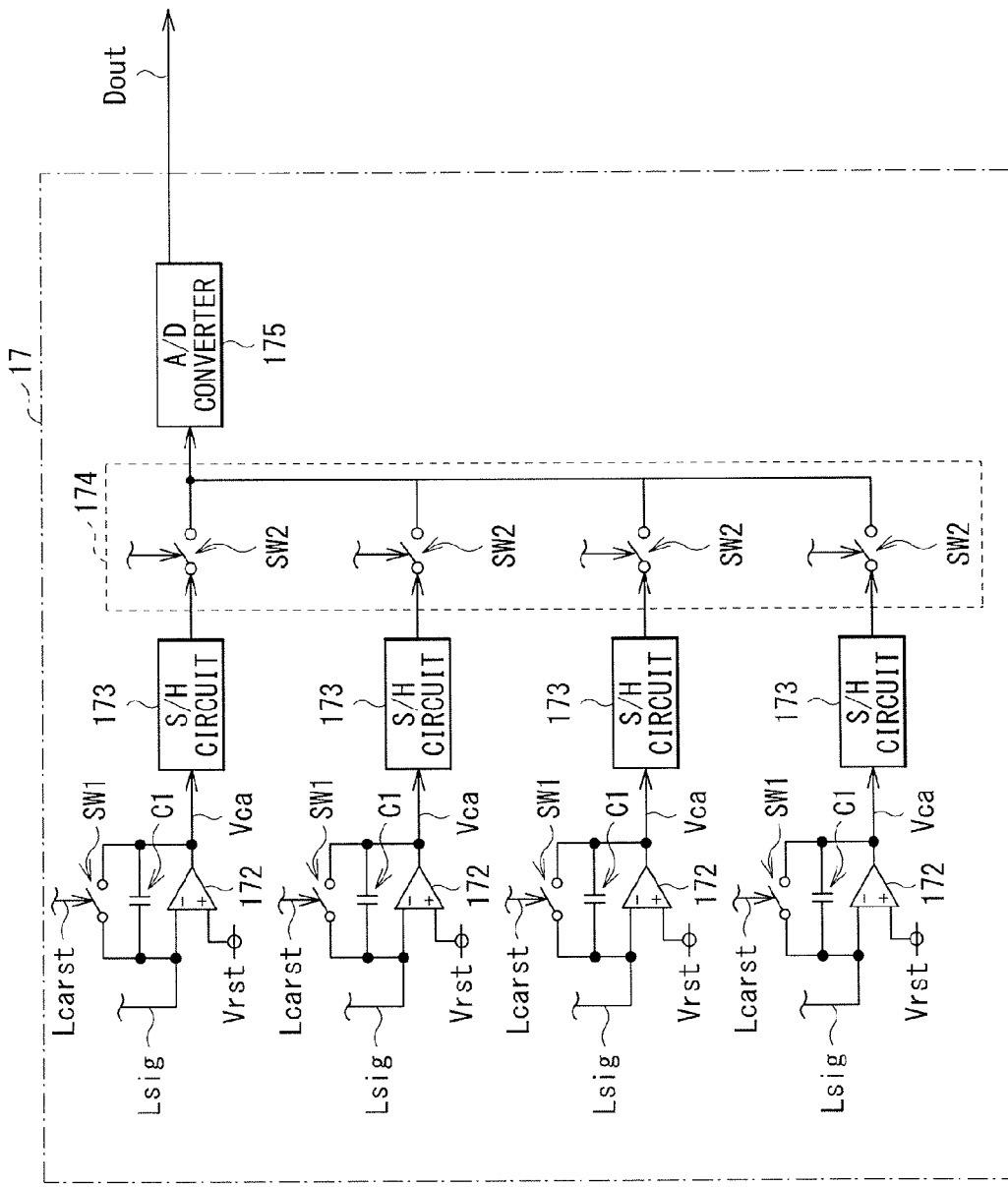
FIG. 5B is a block diagram illustrating a detailed configuration example of a column selection section illustrated in FIG. 1.

For example, as illustrated in FIG. 3 and FIG. 5B, each column selection section 17 includes a charge amplifier 172, a capacitance element (a capacitor or a feedback capacitance element) C1, a switch SW1, a sample/hold (S/H) circuit 173, a multiplexer circuit (a selection circuit) 174 that includes four switches SW2, and an A/D converter 175. In the above-mentioned components, the charge amplifier 172, the capacitance element C1, the switch SW1, the S/H circuit 173, and the switch SW2 are provided for every signal line Lsig, and the multiplexer circuit 174 and the A/D converter 175 are provided for every column selection section 17.

The charge amplifier 172 is an amplifier configured to convert (Q-V convert) the signal charge read out from the signal line Lsig into a voltage. The charge amplifier 172 is configured such that one end of the signal line Lsig is connected to a negative-side (− side) input terminal and a predetermined reset voltage Vrst is input to a positive-side (+ side) input terminal. An output terminal and the negative-side input terminal of the charge amplifier 172 are feedback-connected with each other via a circuit configured by parallel-connecting the capacitance element C1 and the switch SW1 with each other. That is, one terminal of the capacitance element C1 is connected to the negative-side input terminal of the charge amplifier 172, and the other terminal of the capacitance element C1 is connected to the output terminal of the charge amplifier 172. Likewise, one terminal of the switch SW1 is connected to the negative-side input terminal of the charge amplifier 172, and the other terminal of the switch SW1 is connected to the output terminal of the charge amplifier 172. It is to be noted that the ON/OFF state of the switch SW1 is controlled with a control signal (an amplifier reset control signal) supplied from the system control section 16 via an amplifier reset control line Lcarst.

The S/H circuit 173 is disposed between the charge amplifier 172 and the multiplexer circuit 174 (the switch SW2) and is a circuit configured to temporarily hold an output voltage Vca from the charge amplifier 172.

The multiplexer circuit 174 is a circuit selectively establishes or cuts off connection between each S/H circuit 173 and each A/D converter 175 as a result of sequential one-by-one turning-on of the four switches SW2 in accordance with scan driving by the column scanning section 15.

The A/D converter 175 is a circuit that generates and outputs the above-mentioned output data Dout by performing A/D conversion on the output voltage that has been output from the S/H circuit 173 and input into the A/D converter 175 via the switch SW2.

(Column Scanning Section 15)

The column scanning section 15 may be configured including, for example, not-illustrated shift register, address decoder, and so forth and drives in order the respective switches SW2 in the above-described column selection section 17 while scanning the switches SW2. Signals (the above-mentioned output data Dout) that have been read out from the respective pixels 20 via the respective signal lines Lsig are output to the outside in order by such selective scanning by the column scanning section 15 as mentioned above.

(Bias Voltage Control Section 18)

The bias voltage control section 18 may supply the bias voltage Vtg to, for example, the above-described second gate electrode 220B via the read-out control line Lread2 and may correct the bias voltage Vtg in accordance with a shift amount of a threshold voltage Vth of the transistor 22. An operation of correcting the bias voltage Vtg performed by the bias voltage control section 18 may be automatically performed at a predetermined timing, for example, at startup of the image pickup unit, or may be automatically performed every certain period. Alternatively, the above-described correcting operation may be manually performed on the basis of an external input signal (an input signal obtained via a not-illustrated external input section). It is to be noted that, although each operation of the bias voltage control section 18 may be performed on the basis of a control signal from the system control section 16 (as indicated by a dotted arrow A1 in FIG. 1), the bias voltage control section 18 may have such a functional configuration, for example, as follows so as to control the bias voltage independently of the system control section 16 in the present embodiment.

Figure 6A:
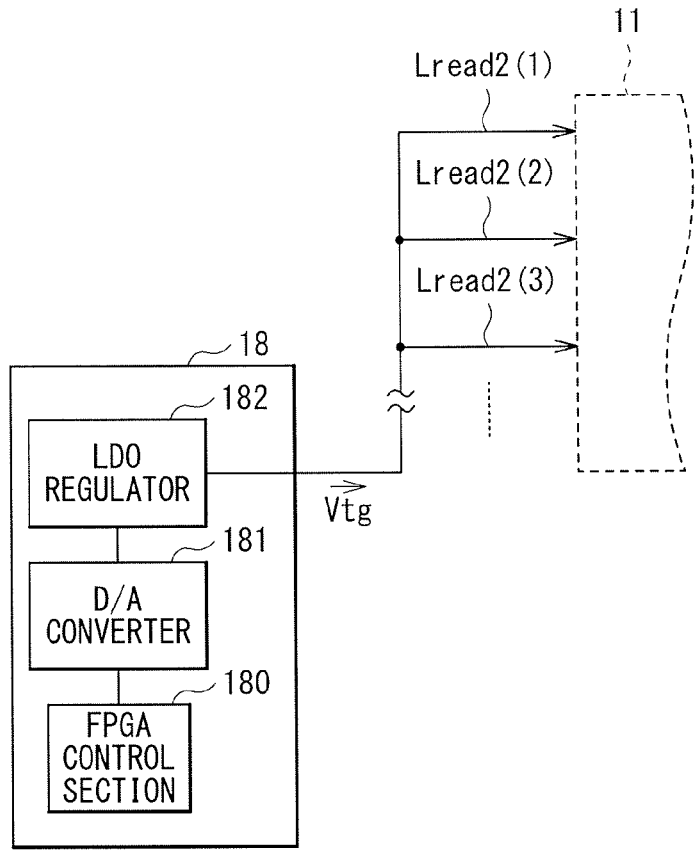
FIG. 6A is a functional block diagram illustrating a configuration of a bias voltage control section illustrated in FIG. 1.
Figure 6B:
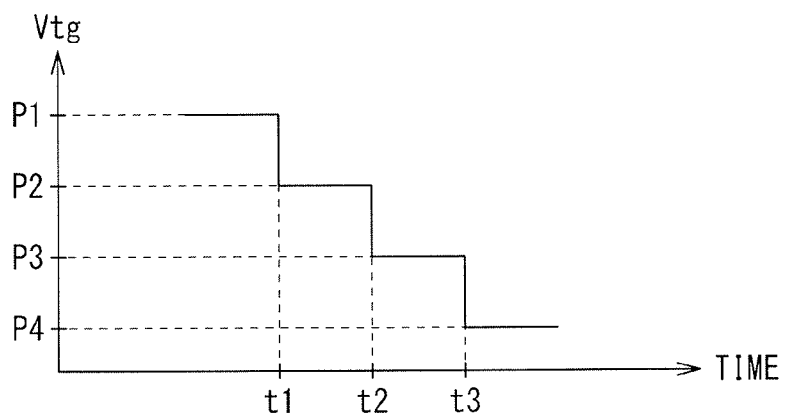
FIG. 6B is a schematic diagram illustrating a bias voltage control example.

FIG. 6A illustrates a functional configuration of the bias voltage control section 18 together with the read-out control line Lread2. It is to be noted that FIG. 6A illustrates, as examples, the read-out control lines Lread2(1) to Lread2(3) for three lines counted from the top in the read-out control lines Lread2 connected to the pixel section 11 for every row of pixels. The bias voltage control section 18 may include, for example, an FPGA (field-programmable gate array) control section 180, a D/A converter 181, and an LDO (Low Drop-Out) regulator 182. In the bias voltage control section 18, voltage values, switching timings, and so forth of the bias voltage Vtg are set by the FPGA control section 180. For example, voltage values p1, p2, p3, and p4 of the bias voltage Vtg and switching timings t1, t2, and t3 of the respective voltage values may be set, for example, as illustrated in FIG. 6B.

The bias voltage Vtg so set is converted from a digital signal into an analog signal by the D/A converter 181, and then is output via the LDO regulator 182, under the control by the FPGA control section 180. The bias voltage Vtg output from the bias voltage control section 18 is supplied to each of the read-out control lines Lread2(1), Lread2(2), Lread2(3), and so on. It may become possible to form the bias voltage control section 18 to be externally attached to an existing panel by using, for example, the FPGA-control-type bias voltage control section 18, and it is possible to achieve such a driving operation of the present embodiment as described later without greatly changing the design of a peripheral circuit section.

(System Control Section 16)

The system control section 16 controls respective operations of the row scanning section 13, the A/D conversion section 14, and the column scanning section 15. Specifically, the system control section 16 includes a timing generator that generates the aforementioned various timing signals (the control signals), and controls driving of the row scanning section 13, the A/D conversion section 14, and the column scanning section 15 on the basis of the various timing signals generated by the timing generator. the respective row scanning section 13, A/D conversion section 14, and column scanning section 15 perform image pickup driving (line sequential image pickup driving) on the plurality of pixels 20 within the image pickup section 11 on the basis of the control by the system control section 16, and thereby, the output data Dout is acquired from the image pickup section 11.

[Functions and Effects of Image Pickup Unit 1]

In the image pickup unit 1 of the present embodiment, when the image pickup light Lin is incident upon the image pickup section 11, the image pickup light Lin is converted (photo-electrically converted) into the signal charge by the photoelectric conversion device 21 in each pixel 20. At that time, a voltage change according to a node capacity occurs in the accumulation node N due to accumulation of the signal charges generated by photoelectric conversion. Specifically, assuming that Cs represents the accumulation node capacity and q represents the generated signal charges, the voltage will be changed (here, decreased) by the amount corresponding to (q/Cs) in the accumulation node N. The input voltage Lin (the voltage corresponding to the signal charges) is supplied to a drain of the transistor 22 in accordance with such a voltage change. When the transistor 22 is turned on in accordance with the row scanning signal supplied from the read-out control line Lread1, the signal charges accumulated in the accumulation node N are read out from the pixels 20 to the signal lines Lsig.

The signal charges so read-out are input to the column selection sections 17 in the A/D conversion section 14 in units of a plurality of (here, four) columns of pixels via the signal lines Lsig. In the column selection section 17, first, Q-V conversion (conversion of the signal charge into the signal voltage) is performed by a charge amplifier circuit configured of the charge amplifier 172 and so forth, on each signal charge input from each signal line Lsig. Then, A/D conversion is performed on each signal voltage so converted (each output voltage Vca from the charge amplifier 172) by the A/D converter 175 via the S/H circuit 173 and the multiplexer circuit 174 to generate the output data Dout (the image pickup signal) configured of the digital signal. Respective pieces of the output data Dout are output from the respective column selection sections 17 in order and transmitted to the outside (or input to a not-illustrated internal memory) in this way. In the following, such an image pickup driving operation will be described in detail.

(Operations in Exposure Period and Read-Out Period)

Figure 7A:
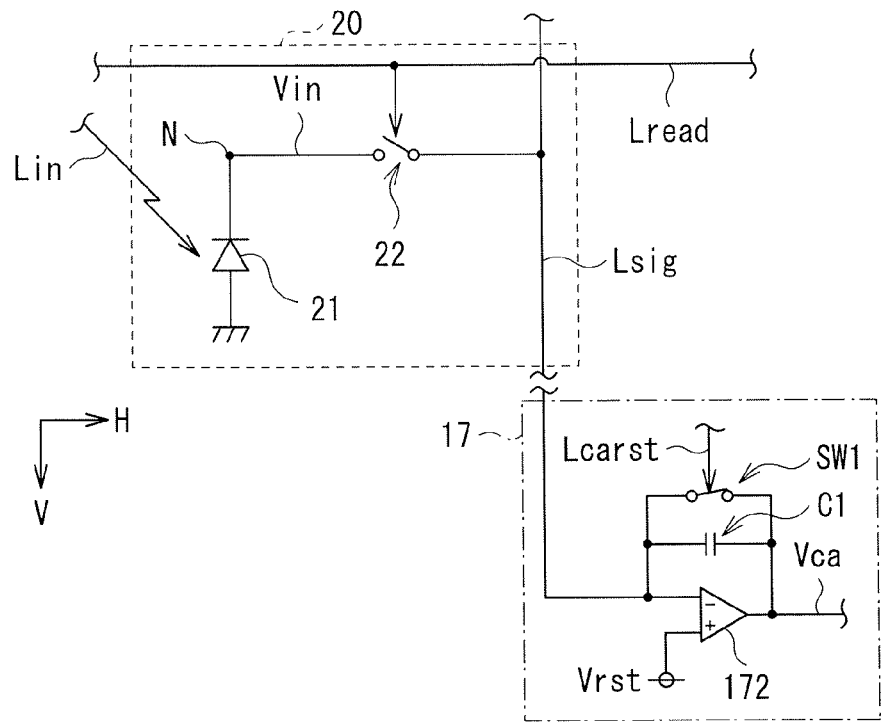
FIG. 7A is a circuit diagram illustrating an example of an operating state in an exposure period.
Figure 7B:
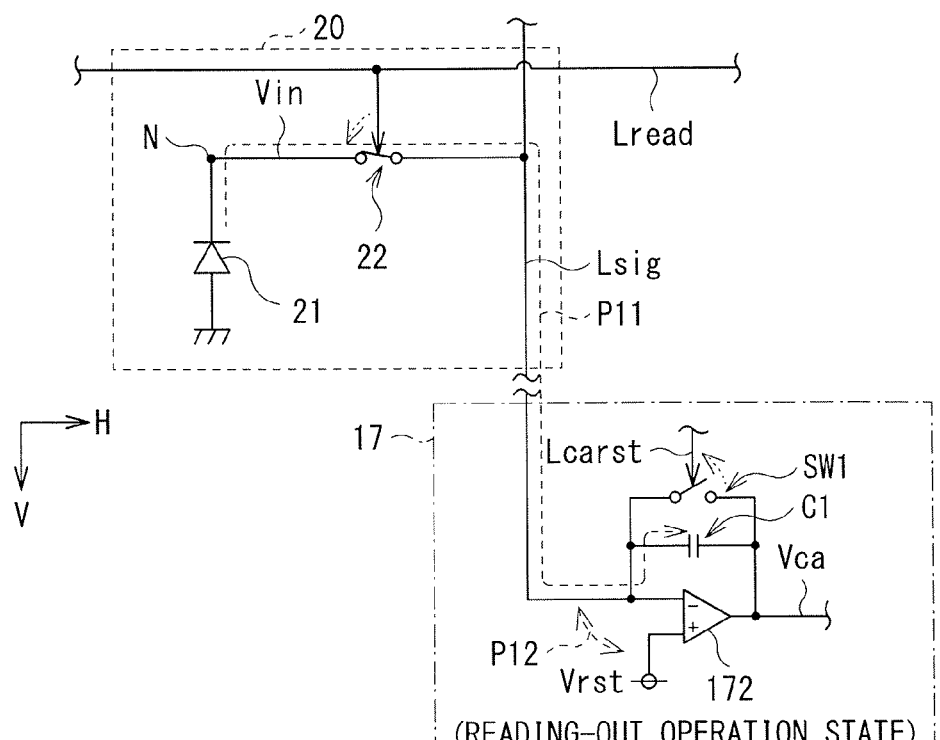
FIG. 7B is a circuit diagram illustrating an example of an operating state in a read-out/reset period.

FIG. 7A and FIG. 7B illustrate operational examples of the pixel 20 and the charge amplifier circuit in the column selection section 17 in an exposure period and a read-out period. It is to be noted that the ON/OFF state of the transistor 22 is illustrated by using the switch for the convenience of description.

First, the transistor 22 is in the OFF state in an exposure period Tex as illustrated in FIG. 7A. In this state, the signal charge that is based on the image pickup light Lin incident upon the photoelectric conversion device 21 in the pixel 20 is accumulated in the accumulation node N, and is not output toward the signal line Lsig side (not read out). On the other hand, since the charge amplifier circuit is in a state after a later-described amplifier resetting operation (a resetting operation of the charge amplifier circuit) has been performed, the switch SW1 is in the ON state, and as a result, a voltage follower circuit is formed.

Then, after the exposure period Tex has elapsed, an operation (a reading-out operation) of reading out the signal charge from the pixel 20 and an operation (a resetting operation, or a pixel resetting operation) for resetting (discharging) the signal charges accumulated in the pixel 20 are performed. In the present embodiment, since the pixel 20 includes a passive pixel circuit, the resetting operation is performed with performance of the above-described reading-out operation. In the following, description will be made by referring to the period in which the reading-out and resetting operation are performed as "read-out/reset period Tr" or simply as "period Tr".

Specifically, the signal charge is read out from the accumulation node N in the pixel 20 toward the signal line Lsig side (see an arrow P11 in the drawing) by turning on the transistor 22 in the read-out/reset period Tr as illustrated in FIG. 7B. Although the signal charge so read-out is input to the charge amplifier circuit, the switch SW1 is in the OFF state (the charge amplifier circuit is in a state that the reading-out operation is being performed) in the charge amplifier circuit at that time. Accordingly, the signal charges input to the charge amplifier circuit are accumulated in the capacitance element C1, and the signal voltage (the output voltage Vca) according to the accumulated charges is output from the charge amplifier 172. It is to be noted that the charges accumulated in the capacitance element C1 are reset (an amplifier resetting operation is performed) by turning on the switch SW1 when the later-described amplifier resetting operation is performed.

In the read-out/reset period Tr, the resetting operation that utilizes an imaginary short-circuit phenomenon of the charge amplifier circuit (the charge amplifier 172) is performed with performance of the above-described reading-out operation as indicated by an arrow P12 in FIG. 7B. Describing in detail, since a voltage on a negative-side input terminal side (the signal line Lsig side) of the charge amplifier 172 becomes almost equal to the reset voltage Vrst that is being applied to a positive-side input terminal of the charge amplifier 172 induced by the imaginary short-circuit phenomenon, also the voltage of the accumulation node N becomes equal to the reset voltage Vrst. In the present embodiment that uses the passive pixel circuit, the voltage of the accumulation node N is reset to the predetermined reset voltage Vrst with performance of the signal charge reading-out operation in the read-out/reset period Tr in this way. It is to be noted that such a reading-out operation is line-sequentially performed on the respective read-out control lines Lread1.

Figure 8:
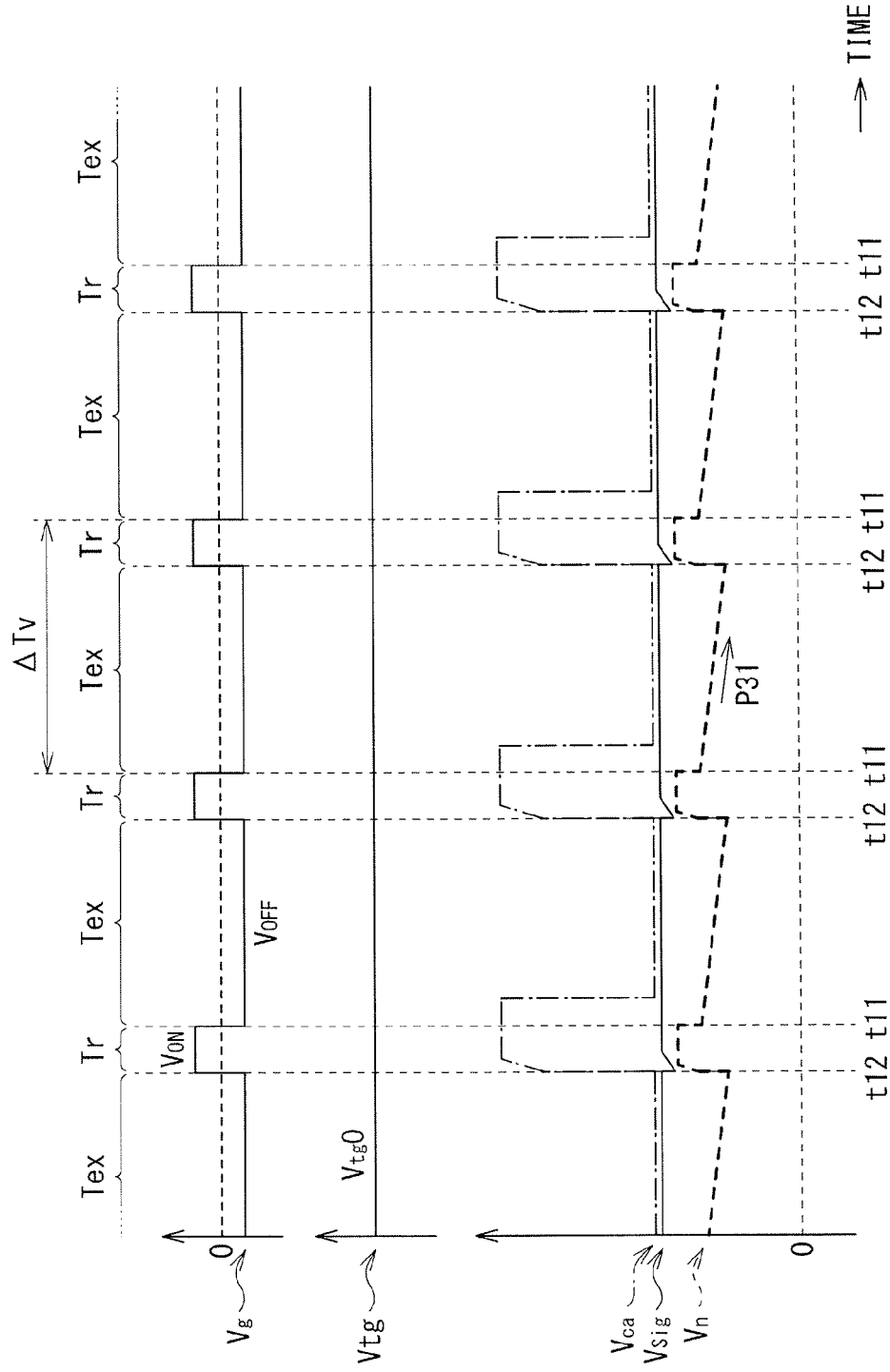
FIG. 8 is a timing chart for explaining an image pickup driving operation.

FIG. 8 illustrates timing waveforms of the respective voltages at the time of the image pickup driving as described above. Specifically, FIG. 8 illustrates the respective timing waveforms of the pulse voltage Vg to be supplied to the read-out control line Lread1, the bias voltage Vtg to be supplied to the read-out control line Lread2, the output voltage Vca from the charge amplifier 172, a voltage Vsig of the signal line Lsig, and a voltage Vn of the accumulation node N. It is to be noted that each waveform is the one exhibited in periods of several preceding and succeeding frames including one frame period ΔTv in the image pickup driving operation for one line.

An exposing operation is performed first in the exposure period Tex (from each timing t11 to each timing t12) in the one frame period ΔTv in the above-described manner (FIG. 7A). Thus, the incident image pickup light Lin is converted (photo-electrically converted) into the signal charge by the photoelectric conversion device 21 in the pixel 20, The voltage Vn of the accumulation node N is gradually changed as the signal charges are accumulated in the accumulation node N (an arrow P31 in FIG. 8). Since, in this example, the cathode side of the photoelectric conversion device 21 is connected to the accumulation node N, the voltage Vn is gradually decreased from the reset voltage Vrst side toward 0 V in the exposure period Tex. Since the transistor 22 is in the OFF state in the exposure period Tex, in an ON voltage Von and an OFF voltage Voff of the pulse voltage Vg, the OFF voltage Voff is applied to the read-out control line Lread1.

Then, in the read-out/reset period Tr (from each timing t12 to each timing t11), the reading-out operation and the resetting operation are performed as described above. Specifically, the ON voltage Von is applied (the voltage is switched from the OFF voltage Voff to the ON voltage Von) to the read-out control line Lread1 (that is, the first gate electrode 220A of the transistor 22). Thus, the transistor 22 is turned ON. Then, the OFF voltage Voff is applied (the voltage is switched from the ON voltage Von to the OFF voltage Voff) to the read-out control line Lread1 (the first gate electrode 220A of the transistor 22) to turn off the transistor 22. It is to be noted that the ON voltage Von is a voltage that is allowed to switch the transistor 22 from the OFF state to the ON state, and may be a voltage (for example, a positive potential) on the high side of the pulse voltage Vg. The OFF voltage Voff is a voltage that is allowed to switch the transistor 22 from the ON state to the OFF state, and may be a voltage (for example, a negative potential) on the low side of the pulse voltage Vg. Thereafter, the switch SW1 in the change amplifier circuit is turned on, and thereby, the charges accumulated in the capacitance element C1 in the charge amplifier circuit are reset (the amplifier resetting operation is performed).

On the other hand, a fixed voltage (having a voltage value Vtg0) is applied to the read-out control line Lread2 (that is, the second gate electrode 220B) during the exposure period Tex and the read-out/reset period Tr at the time of the image pickup driving as described above. The voltage value Vtg0 may be an initially-set voltage value (or a voltage value before the bias voltage is corrected) that has been set, for example, before startup of the image pickup unit and so forth, and may be set to an optional voltage value (for example, a ground voltage value).

In the present embodiment, the ON/OFF state of the transistor 22 is controlled by separately controlling the first gate electrode 220A and the second gate electrode 220B, and applying the pulse voltage Vg and the bias voltage Vtg to the first gate electrode 220A and the second gate electrode 220B, respectively, in this way. In other words, the pulse voltage Vg is increased (or decreased) by the bias voltage Vtg, and the increased pulse voltage Vg is applied to the semiconductor layer 226 (describing in detail, the channel layer 226a), and thereby, the ON/OFF state of the transistor 22 is controlled. The signal charge based on the incident radiation is read out from each pixel 20 in this way.

Some of the radiation (the X-rays) incident upon the image pickup unit 1 leaks into the image pickup section 11 without being subjected to wavelength conversion. When the transistor 22 is exposed to the radiation so leaked into the image pickup section 11, a malfunction as follows may occur. That is, since the transistor 22 has the silicon oxide films in the first gate insulating film 129 and the second gate insulating film 130, when the radiation is incident upon the films that contain oxygen, electrons in the films are excited by so-called photoelectric effect, Compton scattering, electron pair creation or the like. As a result, holes are trapped and accumulated in interfaces and defects in the films of the first gate insulating film 129 and the second gate insulating film 130, and as a result, the threshold voltage Vth of the transistor 22 is shifted to the negative side.

Figure 9:
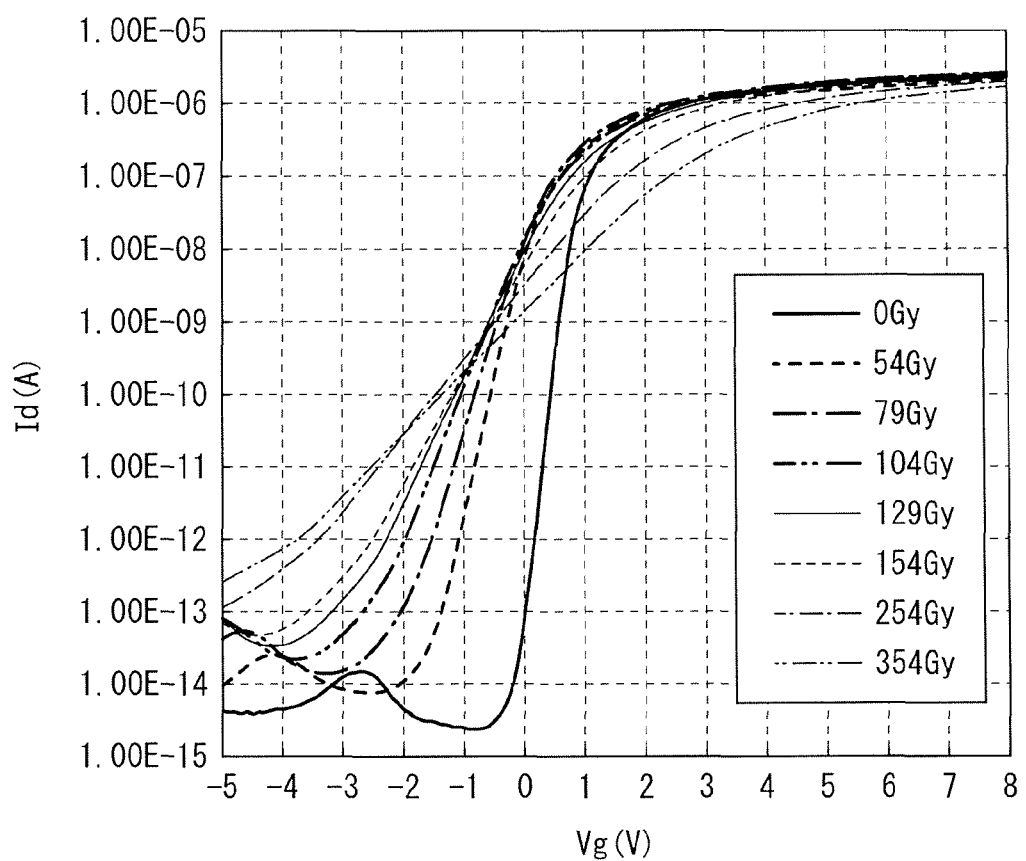
FIG. 9 is a current-voltage characteristic diagram for explaining threshold voltage shifting with X-ray irradiation.

FIG. 9 illustrates a relation of a drain current (Id) with respect to the gate voltage (Vg) (the current-voltage characteristics) in a case in which the transistor 22 made of low temperature polycrystalline silicon has been irradiated with X-rays. As illustrated in FIG. 9, it can be seen that, when the transistor 22 has been irradiated with the X-rays, the threshold voltage Vth is gradually shifted to the negative side as an irradiation amount (dose) of the X-rays is increased from 0

Gy to 54 Gy, to 79 Gy, to 104 Gy, to 129 Gy, to 154 Gy, to 254 Gy, and then up to 354 Gy. In addition, as the irradiation amount is increased, an S (sub-threshold swing) value gets worse accordingly. In addition, an increase in shift amount of the threshold voltage Vth causes a change in OFF current and ON current. It may become difficult to maintain the reliability of the transistor because, for example, the OFF current may be increased to cause current leakage, the ON current is reduced to make signal reading-out difficult, or for other reasons. In the radiographic image pickup unit that uses low-temperature polycrystalline silicon, in particular, the threshold voltage Vth of the transistor 22 is shifted to the negative side due to exposure, and this results in degradation in reliability. Accordingly, such correction (calibration) in which the shift amount of the threshold voltage Vth has been taken into account as described hereinafter is performed in the present embodiment.

(Bias Voltage Correcting Operation)

The bias voltage control section 18 may correct such the bias voltage Vtg as described above in accordance with the shift amount of the threshold voltage Vth of the transistor 22 at a predetermined timing, for example, by the above-described FPGA control. Specifically, correction is performed in the following way.

Figure 10:
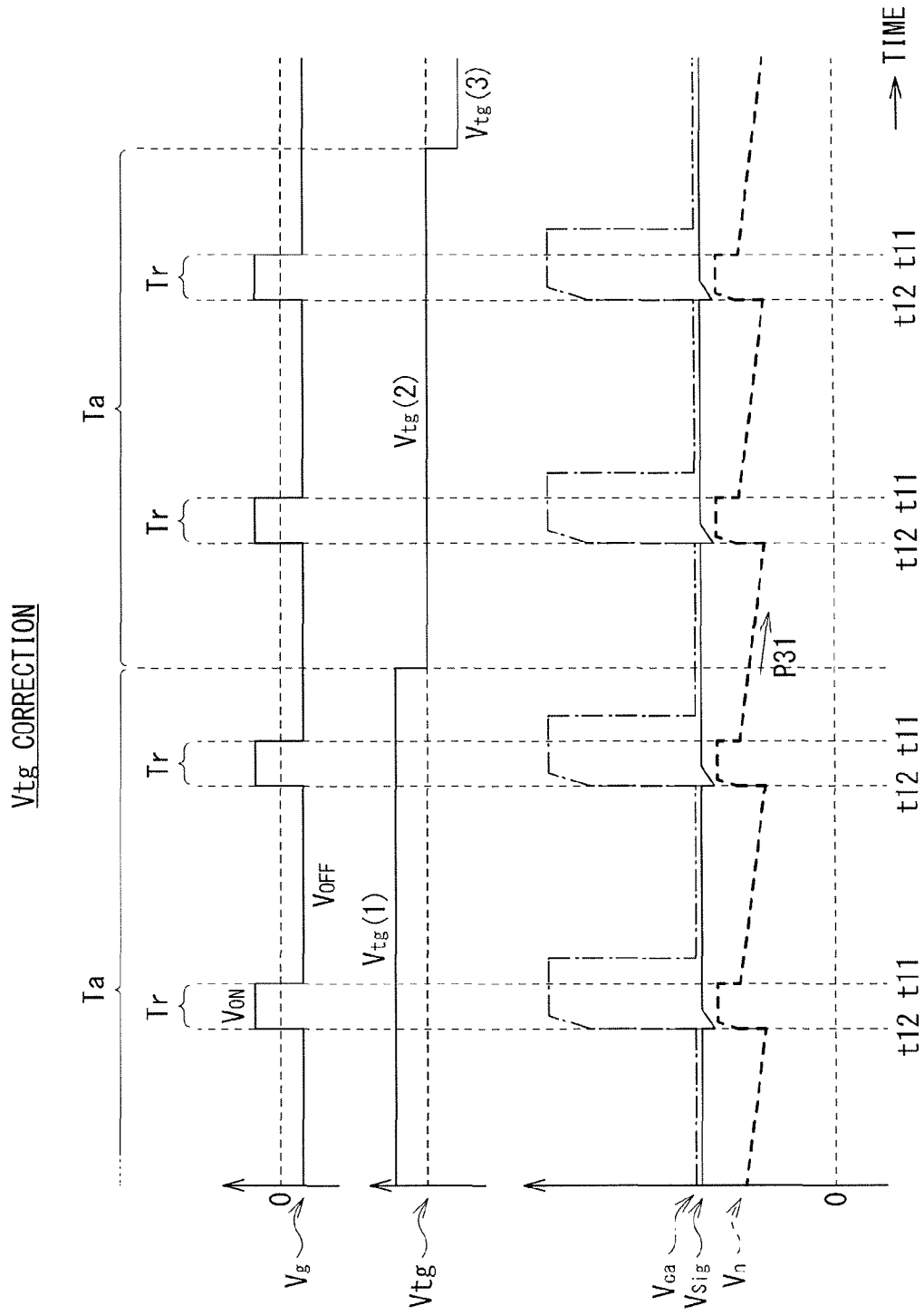
FIG. 10 is a timing chart for explaining a driving operation to be performed when a bias voltage (Vtg) is corrected.

FIG. 10 illustrates timing waveforms of the respective voltages for explaining a driving operation to be performed when correcting the bias voltage Vtg. The timing waveforms of the pulse voltage Vg, the bias voltage Vtg, the output voltage Vca, the voltage Vsig, and the voltage Vn as in the case of performance of the above-described image pickup driving operation are illustrated.

First, the bias voltage control section 18 changes the value of a voltage to be supplied to the read-out control line Lread2 in a dark state (a non-exposed state) and may sample a signal output (for example, a pixel value) for each voltage value. For example, the bias voltage control section 18 may perform the reading-out operation which is similar to the operation performed in the image pickup driving as described above while changing, in a stepwise manner, the voltage value of the bias voltage Vtg to voltage values Vtg(1), Vtg(2), Vtg(3), and so on at a constant intervals (for each period Ta). The period Ta may be arbitrarily set and may be set to, for example, a period that is longer than the one frame period. In addition, the period Ta may be set over several frame periods, and in this case, a mean value of the respective frames may be set as a pixel value corresponding to the value of the voltage applied to the frame concerned. For example, the period Ta may be set to a two-frame period ($2\Delta Tv$), pixel values b1 and b2 may be acquired frame by frame while applying the voltage of the voltage value Vtg(1) (the same thing also applies to the voltage values Vtg(2) and Vtg(3)), and a mean value b12 of the two pixel values b1 and b2 may be set as the pixel value corresponding to the voltage value Vtg(1) (or Vtg(2) or Vtg(3)). In FIG. 10, the voltage value of the bias voltage Vtg may be changed, for example, by 0.5 V each time such that Vtg(1) =−0.5 V, Vtg(2)=0 V, Vtg(3)=0.5 V, and so on by way of example.

Figure 11:
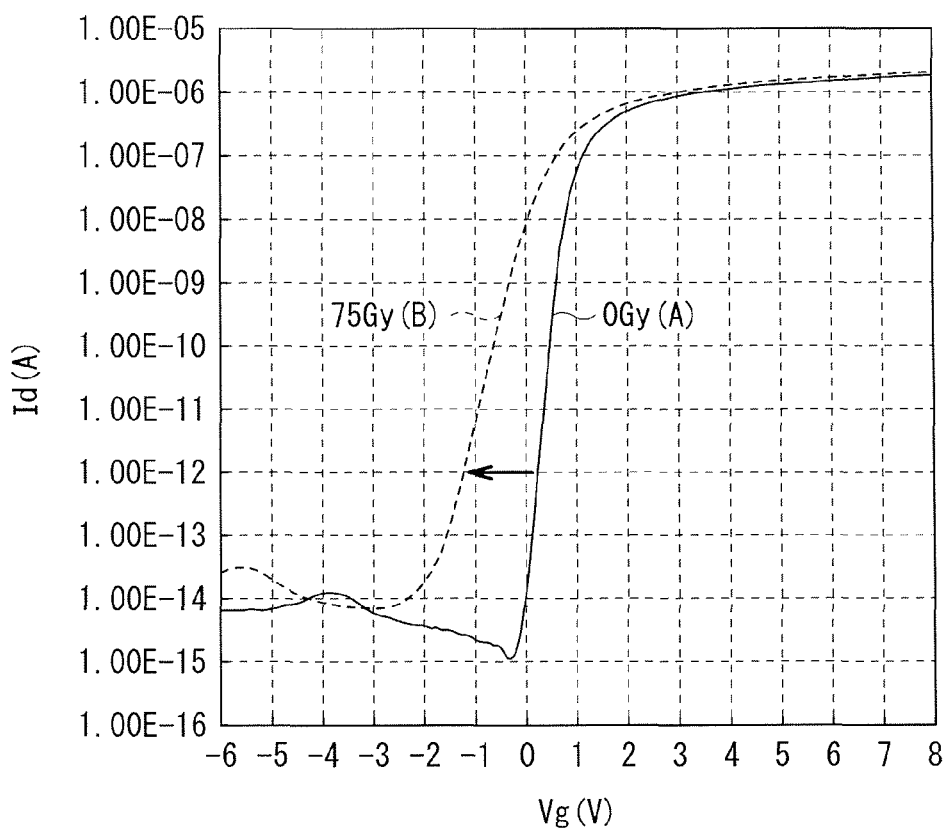
FIG. 11 is a characteristic diagram for explaining a change in current-voltage characteristics in each of a case that X-ray irradiation is not yet performed (0 Gy) and a case that X-ray irradiation has been performed (75 Gy).
Figure 12:
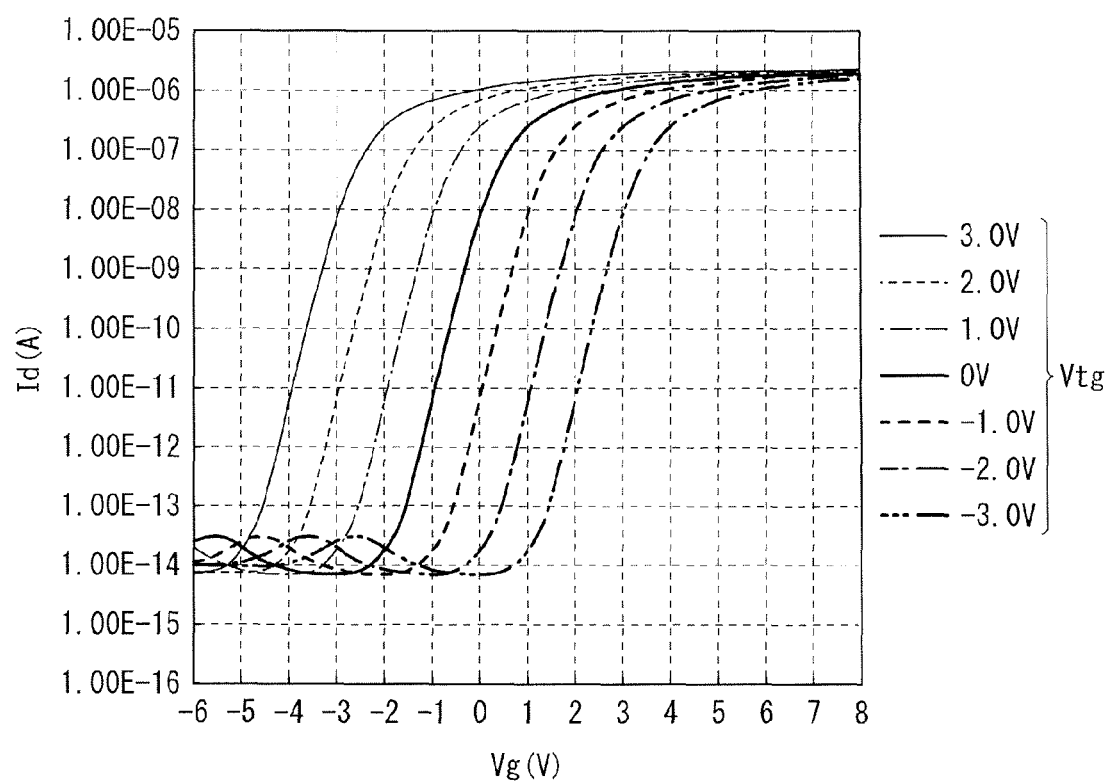
FIG. 12 is a characteristic diagram for explaining shifting of the current-voltage characteristics relative to a change in bias voltage when X-ray irradiation has been performed (75 Gy).

FIG. 11 illustrates current-voltage characteristics (current-voltage characteristics A) in a case where X-ray irradiation is not yet performed (irradiation amount of 0 Gy) and current-voltage characteristics (current-voltage characteristics B) in a case where X-ray irradiation has been performed (a tube voltage of 80 kV and an irradiation amount of 75 Gy) in a state that the bias voltage Vtg is set to the ground voltage (0V). As illustrated in FIG. 11, the current-voltage characteristics are changed with X-ray irradiation and the threshold voltage Vth is greatly shifted to the negative side accordingly. FIG. 12 illustrates the current-voltage characteristics in a case where the value of the bias voltage Vtg to be applied to the transistor 22 having the current-voltage characteristics B obtained after this irradiation with X rays was changed by 1.0 V each time within a range from −3 V to 3 V both inclusive. It is to be noted that a voltage Vds between the drain and the source was set to 0.1 V.

As illustrated in FIG. 12, it can be seen that, as the value of the bias voltage Vtg to be applied to the transistor 22 after irradiation with X-rays is changed, the current-voltage characteristics B shifts in parallel in a positive direction or in a negative direction. That is, it becomes possible to compensate for a shift in threshold voltage Vth of the transistor 22 by changing the bias voltage Vtg and therefore it becomes possible to perform ON/OFF control of the transistor 22 in accordance with shifting of the threshold voltage Vth.

Specifically, an optimum voltage value (a voltage value Vtg1) of the bias voltage Vtg according to the shift amount of the threshold voltage Vth is obtained and the value of the bias voltage Vtg to be used in later-performed image pickup driving operation is changed from the voltage value Vtg0 to a voltage value Vtg1 in the following manner. First, the bias voltage control section 18 holds in advance the threshold voltage (referred to as V0) of the bias voltage Vtg in an initial state (an X-ray irradiation amount of 0 Gy). The threshold voltage V0 in the initial state is compared with a threshold voltage (referred to as V1) of the bias voltage Vtg in correction to determine a value of the bias voltage Vtg according to the shift amount of the threshold voltage Vth of the transistor 22.

Figure 13:
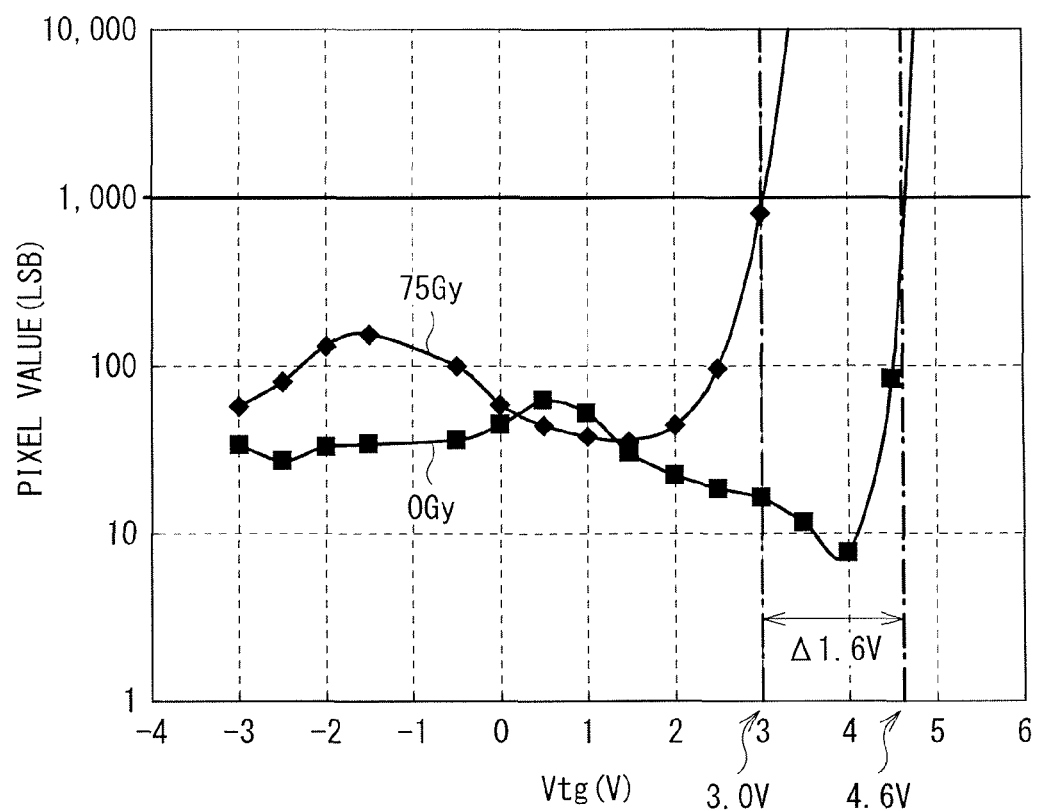
FIG. 13 is a characteristic diagram for explaining a bias voltage correcting operation based on pixel value sampling.

For example, as initial setting of the image pickup unit 1, the pixel values corresponding to the respective voltage values Vtg(1), Vtg(2), Vtg(3), and so on of the bias voltage Vtg in the initial state may be sampled and held in advance by performing an operation similar to the driving operation described in FIG. 10, as illustrated in FIG. 13. A value of the bias voltage Vtg corresponding to a reference value of the pixel values is obtained from the pixel values for the respective voltage values, and the value so obtained is set as the reference voltage V0 of the bias voltage Vtg in the initial state. At the time of correction, the pixel values corresponding to the respective voltage values Vtg(1), Vtg(2), Vtg(3), and so on of the bias voltage Vtg are sampled as described above by performing the driving operation that has been described with reference to FIG. 10. In FIG. 13, the pixel values that have been sampled after the irradiation with the X-rays of 75 Gy are plotted as an example thereof. However, in this example, the reference value V0 (for example, 4.6 V) may be set assuming that the reference value of the pixel value is, for example, 1000 LSB (Least Significant Bit). This pixel value corresponds to the LSB and may be expressed, for example, by the following Expression (1).

Pixel value (LSB)=leak current (A) of the transistor 22/frame rate (fps)/elementary charge (C)/ 158LSB+leak constant A of the photoelectric conversion device 21   (1)

Here, the pixel value was calculated assuming that the frame is 7.5 (fps), 1 LSB was 158 e⁻, the elementary charge was about $1.602 \times E^{-19}$ (C), and the constant A was 0. It is to be noted that the OFF voltage for the bias voltage Vg was set to −4 V. In addition, the above-mentioned value of 1 LSB is merely one example and may be varied depending on an amplifier IC that has been used.

Then, the reference voltage V1 (the bias voltage Vtg corresponding to the pixel value 100 LSB) of the bias voltage Vtg is calculated on the basis of the pixel values corresponding to the respective voltage values and so sampled at the time of correction. The reference voltage V1 so calculated is compared with the initial-state reference voltage V0 to calculate the shift amount of the reference voltage V1 from the reference voltage V0. The shift amount is added to the initially-set voltage value Vtg0 (Expression (2)). For example, when the initially-set voltage value Vtg0 is 0 V, the reference voltage V0 is 4.6 V, and the reference voltage V1 used at the time of correction is 3.0V, the voltage value Vtg1 may be set to about −1.6 V as indicated in Expression (3). That is, in this example, correction that the voltage value of the bias voltage Vtg is changed from Vtg0 (0 V) to Vtg1 (about −1.6 V) is performed.

$$Vtg1=Vtg0+(V1-V0) \quad (2)$$

$$Vtg1=0V+(3.0V-4.6V)=-1.6V \quad (3)$$

In the present embodiment, the bias voltage control section 18 samples the pixel values corresponding to the respective voltage values of the bias voltage Vtg at a predetermined timing and calculates the optimum value (the voltage value Vtg1) of the bias voltage Vtg that is allowed to compensate for the shift of the threshold voltage Vth of the transistor 22 on the basis of the sampled pixel values, as described above. The bias voltage control section 18 outputs the calculated voltage value Vtg1 to the read-out control line Lread2 at the predetermined timing. After the correction has been made, the ON/OFF state of the transistor 22 is controlled while applying the voltage value Vtg1 to the read-out control line Lread2 (the second gate electrode 220B) as the bias voltage Vtg. It is to be noted that the timing of bias voltage correction is arbitrary and the bias voltage may be corrected once and then may be corrected again after a predetermined time period has elapsed. When the correction is performed a plurality of times as described above, a series of correcting operations as described above is performed each time.

It is to be noted that, as a parameter used for bias voltage correction, for example, a change amount of pixels values between a bright state (an exposed state) and the dark state may be used not limitedly to the pixel value obtained in the dark state as described above. In this case, the pixel values in both of the bright state and the dark state may be obtained for the respective voltage values Vtg(1), Vtg(2), Vtg(3), and so on in the initial state and a change amount of the pixel values between the respective states may be sampled.

In the present embodiment, when reading out the signal charge from each pixel 20, the ON/OFF state of the transistor 22 is controlled by applying the pulse voltage Vg to the first gate electrode 220A and applying the bias voltage Vtg to the second gate electrode 220B of the transistor 22 as described above. At that time, the bias voltage control section 18 corrects the bias voltage Vtg in accordance with the shift amount of the threshold voltage Vth of the transistor 22 at the predetermined timing. Accordingly, it becomes possible to attain the high reliability by mitigating the adverse effects caused by shifting of the threshold voltage of the transistor. 22

In the following, modification examples (Modification examples 1 to 8) of the above-described embodiment will be described. It is to be noted that the same symbols are assigned to the same components as those in the above-described embodiment and description thereof will be appropriately omitted.

Modification Example 1

In the above-described embodiment, the voltage value of the bias voltage Vtg that is applied to the read-out control line Lread2 (the second gate electrode 220B) when the image pickup driving operation is to be performed is fixed during a period counted up to the timing that voltage value is switched by performing the correcting operation. However, if the second gate electrode 220B has a fixed potential, a parasitic capacitance is generated between the second gate electrode 220B and the semiconductor layer 226 (describing in detail, the channel layer 226a). Accordingly, the response of the switching operation (the ON/OFF switching operation of the transistor 22) to the pulse voltage Vg to be applied to the read-out control line Lread1 (the first gate electrode 220A) may be sometimes delayed.

Therefore, in the present modification example, driving for holding the read-out control line Lread2 (the second gate electrode 220B) in a so-called floating state during a period (for example, the period Tr in FIG. 8) that the ON voltage Von of the pulse voltage Vg is being applied to the read-out control line Lread1 is performed.

Figure 14:
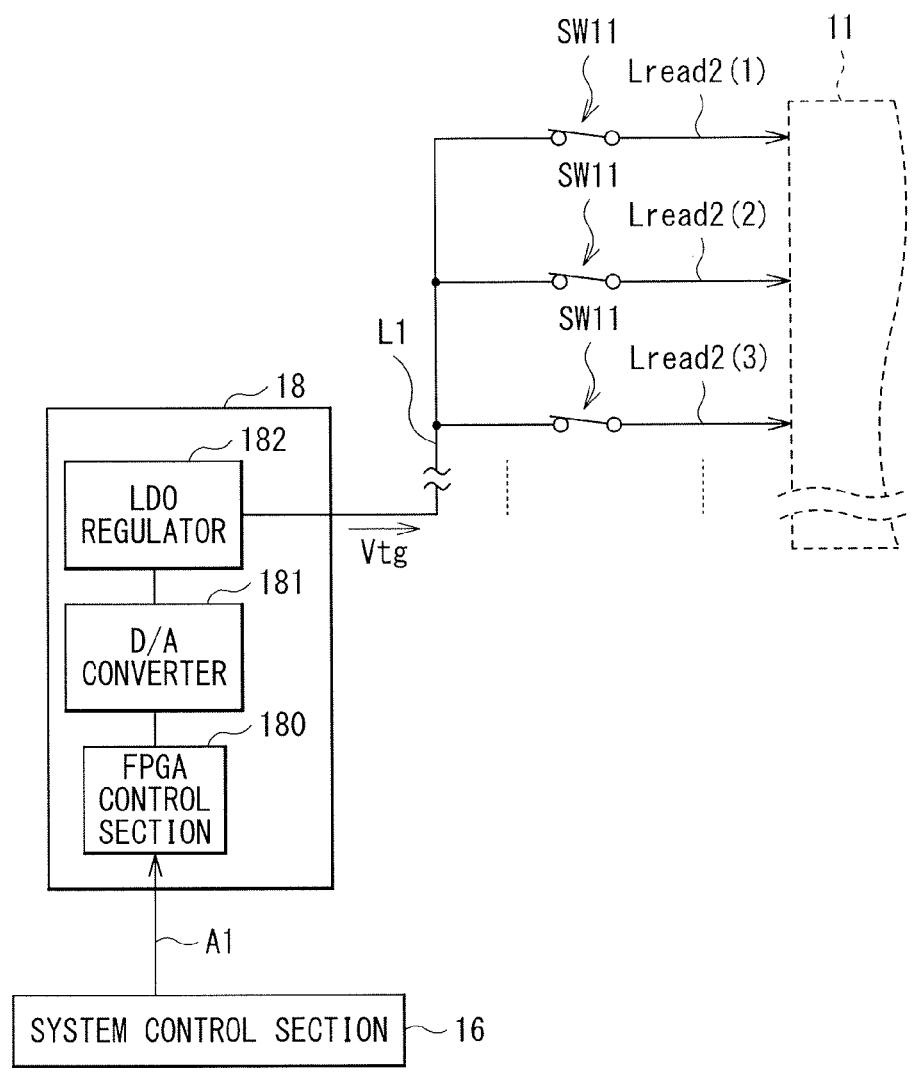
FIG. 14 is a functional block diagram illustrating a contact configuration example according to Modification example 1 and a bias voltage control section.

FIG. 14 is a diagram illustrating a contact point configuration example of the present modification example together with the bias voltage control section 18 and the system control section 16. As illustrated in the drawing, in the present embodiment, a switch (SW11) is included between the read-out control line Lread2 and the bias voltage control section 18 (a voltage correction line L1). ON/OFF switching of the switch SW11 may be performed in accordance with a not-illustrated control signal (for example, a control signal from the row scanning section).

In the present modification example, the switch SW11 is controlled to be in the OFF state (an open state) in synchronization with a timing that the ON voltage Von is applied to the read-out control line Lread1 owing to the above-described configuration. Thus, the second gate electrode 220B enters the floating state and generation of the parasitic capacitance as described above is suppressed in the read-out/reset period Tr. On the other hand, in a period (that is, an OFF period of the transistor 22) other than such the read-out/reset period Tr as described above, the switch SW11 is controlled to be in the ON state (a closed state) and a driving operation similar to that in the above-described embodiment is performed. During the OFF period, it is possible to suppress an increase in off-leak and so forth caused by threshold voltage shifting by applying the bias voltage Vtg that has been set in accordance with the shift amount of the threshold voltage in this way. Accordingly, it is possible to obtain an effect equivalent to that in the above-described embodiment while suppressing generation of the parasitic capacitance when the reading-out operation is performed.

Modification Example 2

Although, in the above-described Modification example 1, the read-out control line Lread2 has been switched to the floating state in the period that the ON voltage Von is applied to the read-out control line Lread1, a voltage having the same value as the ON voltage Von may be applied to the read-out control line Lread2 as in the present modification example. That is, the read-out control lines Lread1 and Lread2 may be held at the same potential during the read-out/reset period Tr.

Figure 15:
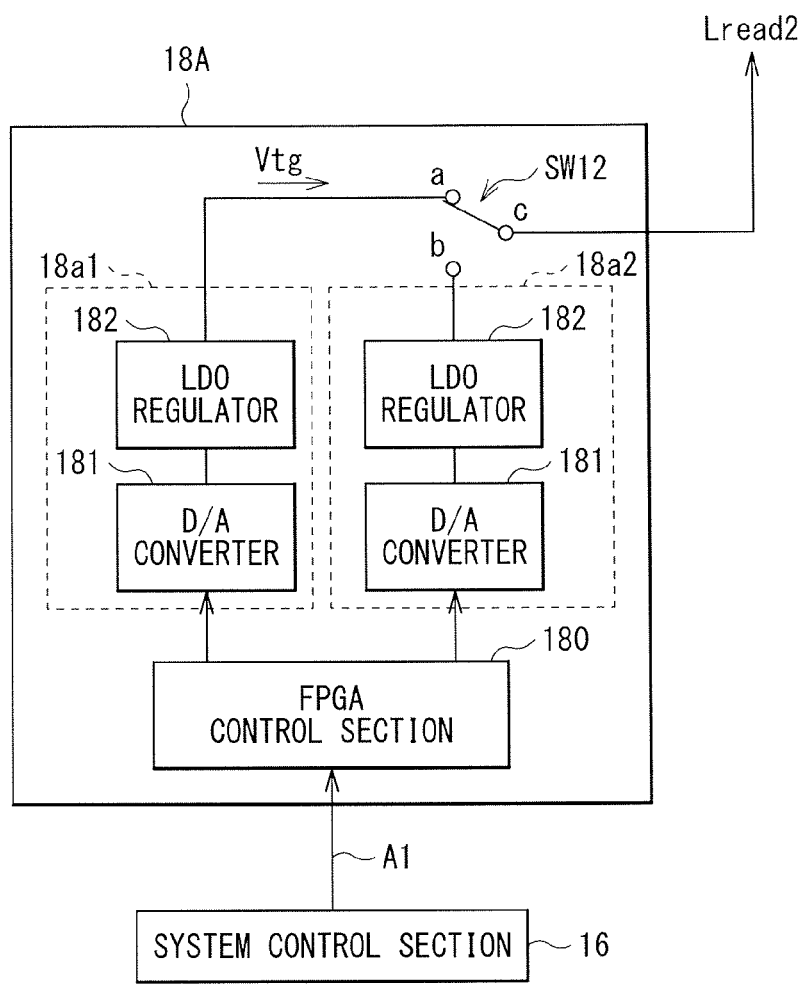
FIG. 15 is a functional block diagram illustrating a configuration of a bias voltage control section according to Modification example 2.

FIG. 15 illustrates a functional configuration of a bias voltage control section 18A of the present modification example together with the system control section 16. As illustrated in the drawing, in the present modification example, the bias voltage control section 18A includes a switch (a switch SW12) having a so-called common contact c on the read-out control line Lread2. The switch SW12 is a change-over switch that includes the common contact c and two contacts a and b, and alternative output of binary voltage values from the bias voltage control section 18A is made possible owing to provision of the switch SW12. For example, the bias voltage control section 18A may include a circuit section 18a1 that generates a voltage value of the bias voltage Vtg and a circuit section 18a2 that generates a voltage value of a voltage to be applied in the read-out/reset period Tr. The circuit sections 18a1 and 18a2 are controlled by the FPGA control section 180. The circuit section 18a1 is connected to the contact a of the switch SW12 and the circuit section 18a2 is connected to the contact b of the switch SW12. It is to be noted that changing-over of the switch SW12 may be performed in accordance with a not-illustrated control signal, for example, so as to be connected to the contact a in a normal state (when the switch SW12 is in the OFF state) and to be connected to the contact b in operation (when the switch SW12 is in the ON state).

In the present modification example, the read-out control line Lread2 is connected to the circuit section 18a2 via the contact b of the switch SW12 in synchronization of a timing that the ON voltage Von is applied to the read-out control line Lread1 owing to the above-described configuration. Thus, the ON voltage Von is applied to the read-out control line Lread2 and the read-out control lines Lread1 and Lread2 are set at the same potential. Thus, it becomes possible to suppress generation of such parasitic capacitance as described above during the read-out/reset period Tr. On the other hand, the read-out control line Lread2 is connected to the circuit section 18a1 via the contact a, and a driving operation similar to that in the above-described embodiment is performed in a period (that is, a period that the transistor 22 is in the OFF state) other than the read-out/reset period Tr. Accordingly, it is possible to obtain an effect equivalent to that in the above-described embodiment and Modification example 1 also in the present modification example.

Modification Example 3

Figure 16:
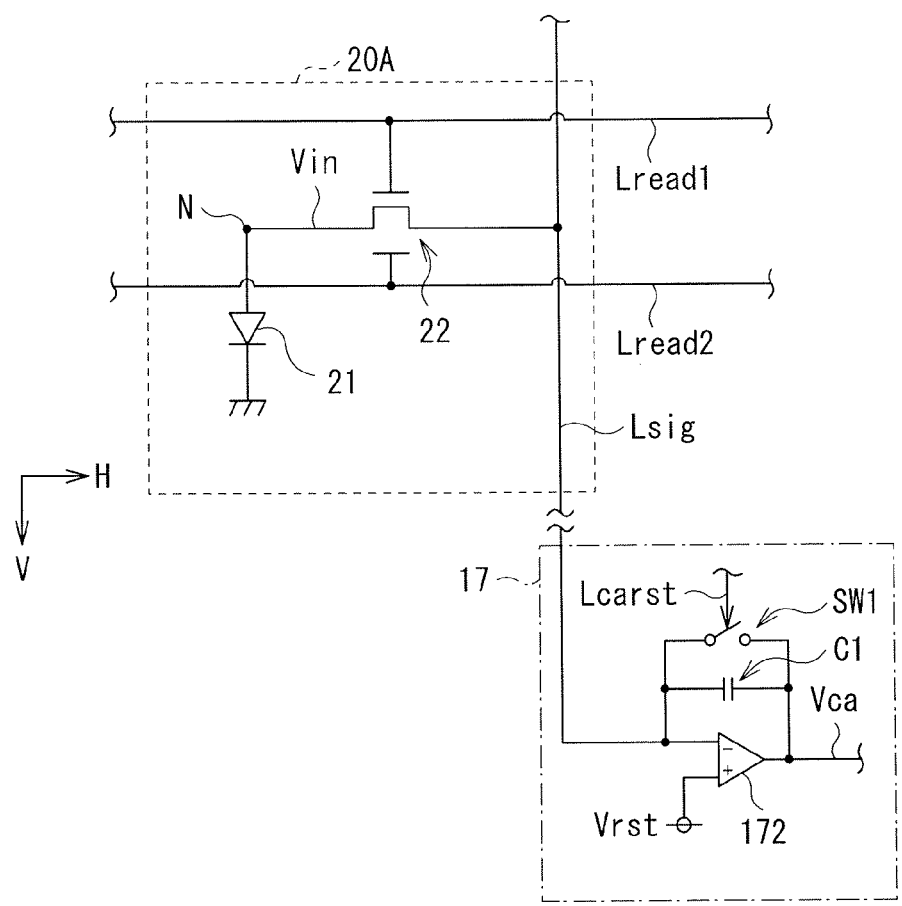
FIG. 16 is a circuit diagram illustrating a configuration of a pixel and so forth according to Modification example 3.

FIG. 16 illustrates a circuit configuration of a pixel (a pixel 20A) according to Modification example 3 together with a circuit configuration example of the column selection section 17 described in the above embodiment. The pixel 20A of the present modification example has the so-called passive circuit configuration similarly to the pixel 20 of the embodiment, and includes one photoelectric conversion device 21 and one transistor 22. In addition, the read-out control lines Lread1 and Lread2 that extend in the H direction and the signal line Lsig that extends in the V direction are connected to the pixel 20A.

However, in the pixel 20A of the present modification example, the anode of the photoelectric conversion device 21 is connected to the accumulation node N and the cathode of the photoelectric conversion device 21 is connected to the ground (the earth) unlike the pixel 20 of the above-described embodiment. The accumulation node N may be connected to the anode of the photoelectric conversion device 21 in the pixel 20A as in the present modification example, and it is possible to obtain an effect similar to that by the image pickup unit 1 according to the above-described embodiment even when the pixel 20A is configured as described above.

Modification Example 4

Figure 17:
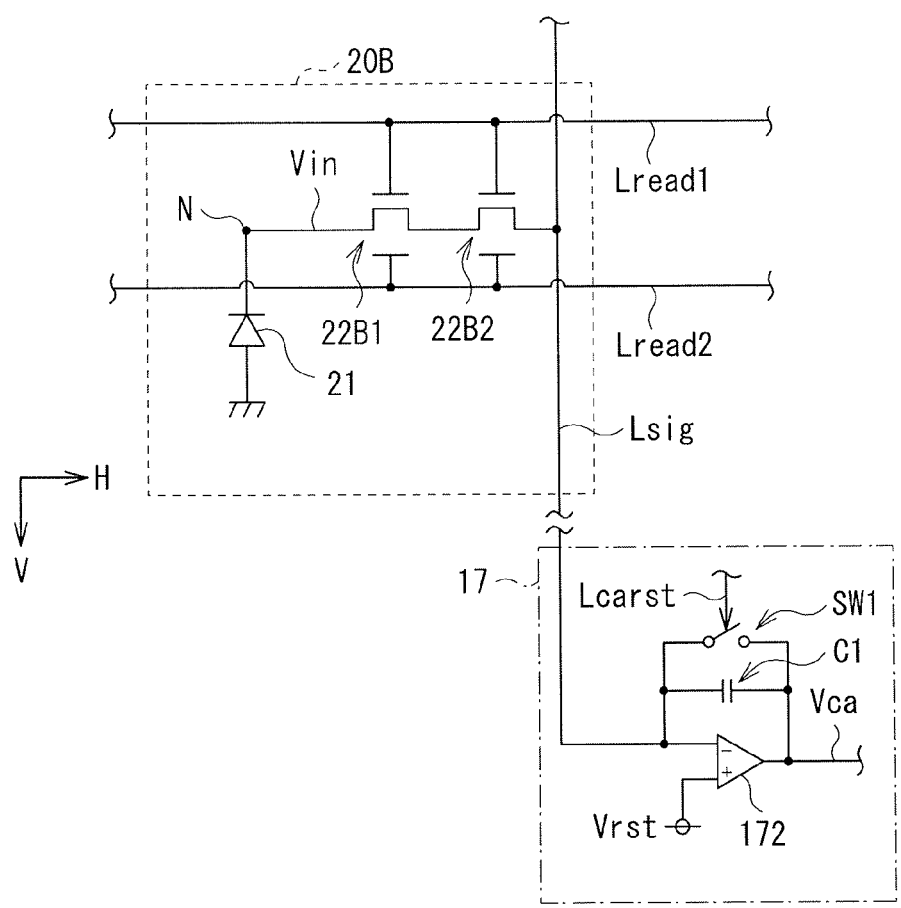
FIG. 17 is a circuit diagram illustrating a configuration of a pixel and so forth according to Modification example 4.

FIG. 17 illustrates a circuit configuration of a pixel (a pixel 20B) according to Modification example 4 together with a circuit configuration example of the column selection section 17 described in the above embodiment. The pixel 20B of the present modification example has the so-called passive circuit configuration similarly to the pixel 20 of the embodiment, includes one photoelectric conversion device 21, and is connected to the read-out control lines Lread1 and Lread2 that extend in the H direction and the signal line Lsig that extends in the V direction.

However, in the present modification example, the pixel 20B includes two transistors 22 (transistors 22B1 and 22B2). The transistors 22B1 and 22B2 are connected in series with each other (a source or drain of one transistor is electrically connected to a source or drain of the other transistor, or the semiconductor layers 226 in the respective transistors are coupled and integrally formed as one layer as described later). In addition, a gate of one of the transistors 22B1 and 22B2 is connected to the read-out control line Lread1 and a gate of the other transistor is connected to the read-out control line Lread2.

Figure 18:
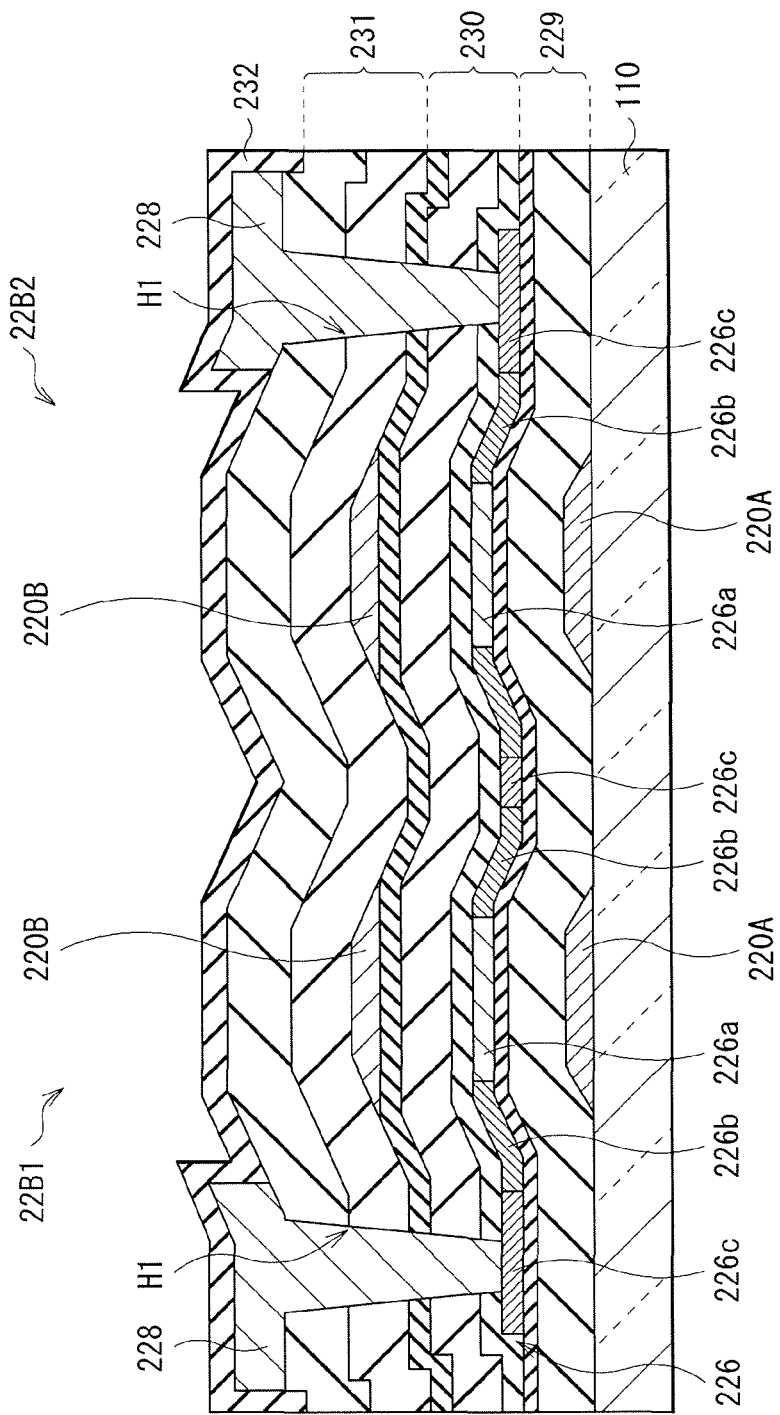
FIG. 18 is a sectional diagram illustrating a schematic configuration of two transistors illustrated in FIG. 17.

FIG. 18 illustrates a sectional configuration example of the two transistors 22B1 and 22B2 described above. As illustrated in FIG. 18, two laminated structures in each of which the semiconductor layer 226 is sandwiched between the two gate electrodes 220A and 220B are formed side by side, and one pair of the source-drain electrodes 228 are disposed on both sides of one set of these laminated structures. It is to be noted that, in this example, the semiconductor layers 226 in the transistors 22B1 and 22B2 are integrated. Specifically, the two first gate electrodes 220A are included in selective regions on the substrate 110 and the first gate insulating film 229 and the semiconductor layer 226 are formed so as to cover the two first gate electrodes 220A. The second gate insulating film 230 is formed on the semiconductor layer 226 and the second gate electrodes 220B are disposed in selective regions (regions facing the respective two first gate electrodes 220A) on the second gate insulating film 230. The first interlayer insulating film 231 is formed so as to cover the second gate electrodes 220B and the one pair of source-drain electrodes 228 are formed on the first interlayer insulating film 231 so as to fill up the contact holes H1. The second interlayer insulating film 232 is formed on the source-drain electrodes 228 so as to cover the two transistors 22B1 and 22B2. It is to be noted that it is possible to reduce the off-leak by disposing the gate electrodes side by side as in the present modification example.

The two series-connected transistors 22B1 and 22B2 may be provided in the pixel 20B in this way, and it is possible to reduce the influence caused by shifting of the threshold voltage Vth by performing the image pickup driving operation and correcting operation as described in the above embodiment also in this case. It is to be noted that three or more transistors may be series-connected with one another.

Modification Examples 5 and 6

Figure 19:
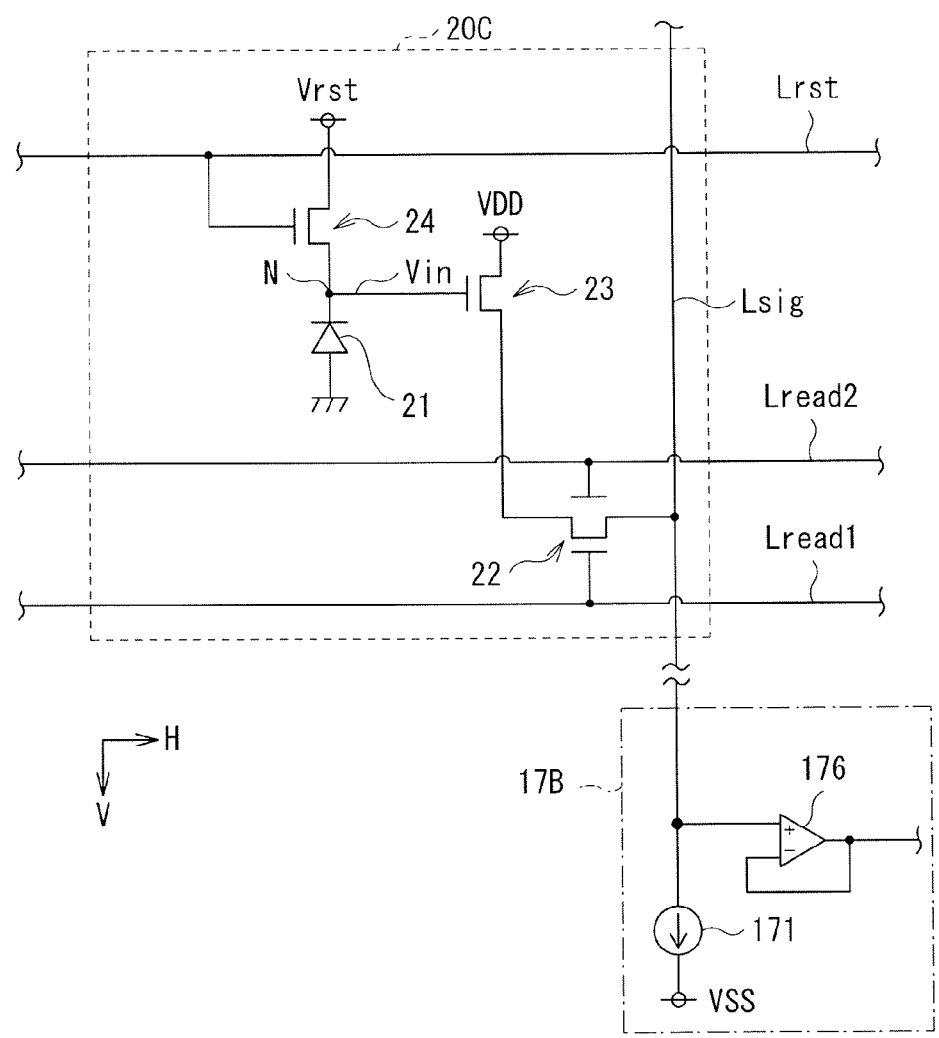
FIG. 19 is a circuit diagram illustrating a configuration of a pixel and so forth according to Modification example 5.
Figure 20:
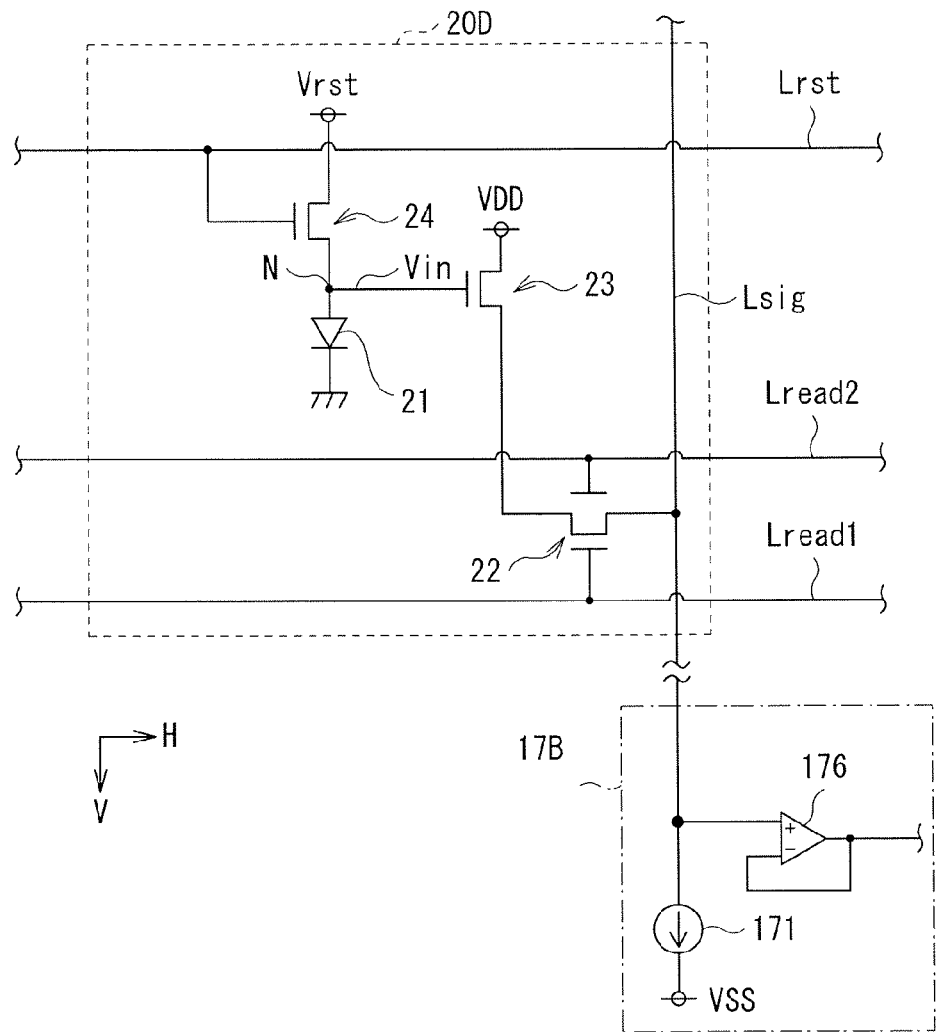
FIG. 20 is a circuit diagram illustrating a configuration of a pixel and so forth according to Modification example 6.

FIG. 19 illustrates a circuit configuration of a pixel (a pixel 20C) according to Modification example 5 together with a circuit configuration example of a column selection section 17B that will be described later. In addition, FIG. 20 illustrates a circuit configuration of a pixel (a pixel 20D) according to Modification example 6 together with the circuit configuration example of the column selection section 17B. Each of the pixels 20C and 20D according to Modification examples 5 and 6 has a so-called active pixel circuit unlike the pixels 20, 20A, and 20B described so far.

Each of the active-type pixels 20C and 20D includes one photoelectric conversion device 21 and three transistors 22, 23, and 24. The read-out control lines Lread1 and Lread2 that extend in the H direction and the signal line Lsig that extends in the V direction are connected to each of the pixels 20C and 20D.

In each of the pixels 20C and 20D, one gate of the transistor 22 is connected to the read-out control line Lread1 and the other gate thereof is connected to the read-out control line Lread2, a source thereof is connected to the signal line Lsig, and a drain thereof is connected to a drain of the transistor 23 that configures a source follower circuit. A source of the transistor 23 is connected to a power source VDD and a gate thereof is connected, via the accumulation node N, to the cathode (the example in FIG. 19) or the anode (the example in FIG. 20) of the photoelectric conversion device 21 and to a drain of the transistor 24 that functions as a transistor for reset. A gate of the transistor 24 is connected to the reset control line Lrst and a reset voltage Vrst is to be applied to a source thereof. In Modification example 5 in FIG. 19, the anode of the photoelectric conversion device 21 is connected to the ground, while in Modification example 6 in FIG. 20, the cathode of the photoelectric conversion device 21 is connected to the ground. It is to be noted that, although only one of the gates of each of the transistors 23 and 24 is illustrated in FIG. 20 for simplification, describing in detail, each of the transistors 23 and 24 has a device structure that includes the two gate electrodes that are similar to those in the transistor 22. Since, the two gate electrodes may be driven, for example, in a short-circuited state in each of the transistors 23 and 24, the device structure of each of the transistors 23 and 24 may become equivalent to the device structure that includes one gate in circuit configuration. However, it is possible to obtain the effect of the embodiment of the present disclosure as long as at least the transistor 22 has the device structure that includes the two gate electrodes as described above in the three transistors 22, 23, and 24.

In addition, in each of Modification examples 5 and 6, the column selection section 17B includes a constant current source 171 and an amplifier 176 in place of the charge amplifier 172, the capacitance element C1, and the switch SW1 that the aforementioned column selection section 17 includes. In the amplifier 176, the signal line Lsig is connected to a positive-side input terminal and a negative-side input terminal and an output terminal are connected to each other to form a voltage follower circuit. It is to be noted that one terminal of the constant current source 171 is connected to one end side of the signal line Lsig and a power source VSS is connected to the other terminal of the constant current source 171.

Modification Examples 7 and 8

Figure 21A:
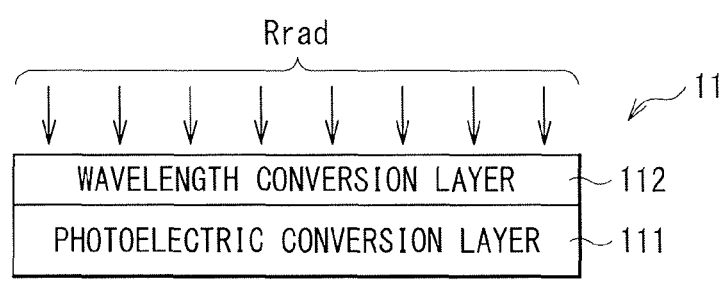
FIG. 21A is a schematic diagram illustrating a schematic configuration of an image pickup section according to Modification example 7.
Figure 21B:
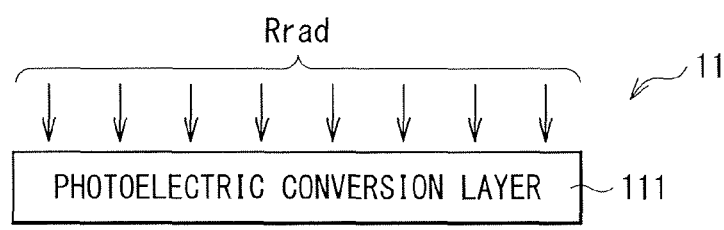
FIG. 21B is a schematic diagram illustrating a schematic configuration example of an image pickup section according to Modification example 8.

FIG. 21A and FIG. 21B schematically illustrate schematic configurations of the image pickup section 11 according to Modification examples 7 and 8, respectively. When the image pickup unit 1 of the above-described embodiment is a radiographic image pickup unit, the image pickup section 11 has the configuration of either Modification example 7 or Modification example 8.

The image pickup section 11 according to Modification example 7 illustrated in FIG. 21A is to be applied to a so-called indirect-conversion-type radiographic image pickup unit, and includes a wavelength conversion layer 112 on the photoelectric conversion layer 111 (a light receiving face side). The wavelength conversion layer 112 converts radiation Rrad (α rays, β rays, γ rays, X rays, and so forth) into light of a wavelength in a sensitivity area of the photoelectric conversion layer 111, and it becomes possible to read out information based on the radiation Rrad in the photoelectric conversion layer 111 owing to provision of the wavelength conversion layer 112. The wavelength conversion layer 112 may be configured of, for example, a phosphor (for example, a scintillator) that converts the radiation such as the X rays and so forth into visible light. The wavelength conversion layer 112 so configured may be a lamination in which, for example, an organic flattening film, a flattening film made of a spin-on glass material and so forth, and a phosphor film are laminated in this order. The phosphor film may be made of, for example, CsI (added with Tl), $Gd_2O_2S$, BaFX (X is Cl, Br, I, and so forth), NaI, and/or $CaF_2$ and so forth.

The image pickup section 11 according to Modification example 8 illustrated in FIG. 21B is to be applied to a so-called direct-conversion-type radiographic image pickup unit, and includes the photoelectric conversion layer 111 that absorbs the incident radiation Rrad and converts the radiation into an electric signal. The photoelectric conversion layer 111 of the present modification example may be configured of, for example, an amorphous selenium (a-Se) semiconductor, a cadmium telluride (CdTe) semiconductor, and so forth. It is to be noted that a circuit configuration of the pixel 20 in the case of the direct-conversion-type image pickup unit is equivalent to a configuration that the photoelectric conversion device 21 is replaced with a capacitor in the respective components illustrated in FIG. 3.

Such an indirect-conversion-type or direct-conversion-type radiographic image pickup unit as described above is utilized as various types of image pickup units that acquire the electric signal on the basis of the incident radiation Rrad. This image pickup unit may be applicable to, for example, a medical X-ray image pickup unit (such as a digital radiography), a baggage-screening X-ray image pickup unit used in an airport and so forth, an industrial X-ray image pickup unit (for example, a unit for examining dangerous goods and so forth in a container), and so forth.

Application Example

The image pickup units according to the above-described embodiment and modification examples (Modification examples 1 to 8) are also applicable to such an image pickup display system as described hereinafter.

Figure 22:
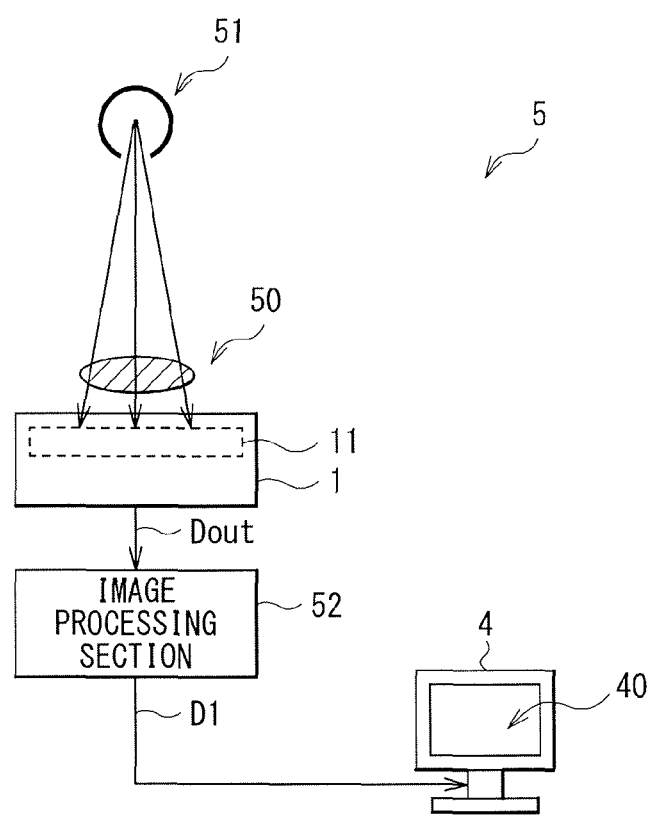
FIG. 22 is a schematic diagram illustrating a schematic configuration of an image pickup display system according to an application example.

FIG. 22 schematically illustrates a schematic configuration example of an image pickup display system (an image pickup display system 5) according to an application example. The image pickup display system 5 includes the image pickup unit 1 that includes the image pickup section 11 and so forth according to any of the above-described embodiment and modification examples, an image processing section 52, and a display 4. In this example, the image pickup display system 5 is configured as an image pickup display system using radiation (a radiographic image pickup display system).

The image processing section 52 generates image data D1 by performing predetermined image processing on the output data Dout (the image pickup signal) output from the image pickup unit 1. The display 4 performs image display based on the image data D1 generated by the image processing section 52 on a predetermined monitor screen 40.

In this image pickup display system 5, the image pickup unit 1 (here, the radiographic image pickup unit) acquires the image data (the output data) Dout of an object 50 on the basis of irradiation light (here, the radiation) radiated from a light source (here, a radiation source such as an X-ray source) 51 toward the object 50 and outputs the data so acquired to the image processing section 52. The image processing section 52 performs the above-described predetermined image processing on the input image data Dout and outputs the image data (the display data) D1 that has been subjected to the image processing to the display 4. The display 4 displays image information (a picked-up image) on the monitor screen 40 on the basis of the input image data D1.

Since, in the image pickup display system 5 of the present application example, it is possible to acquire the image of the object 50 as the electric signal by the image pickup unit 1 in this way, it becomes possible to display the image by transmitting the acquired electric signal to the display 4. That is, it becomes possible to observe the image of the object 50 without using such a radiographic film as has ever been used and it becomes possible to cope with moving image capturing and moving image display.

It is to be noted that, although, in the present application example, description has been made by giving an example that the image pickup unit 1 is configured as the radiographic image pickup unit and the image pickup display system is configured as the system using the radiation accordingly, the image pickup display system according to an embodiment of the present disclosure is also applicable to a system using an image pickup unit of another type.

Although the embodiment, the modification examples, and the application example of the present disclosure have been given as described above, the contents of the present disclosure are not limited to the above-mentioned embodiment, modification examples, and application example, and may be modified in a variety of ways. For example, although, in the above-mentioned embodiment, modification examples, and application example, the configuration that first gate electrode 220A is arranged under the semiconductor layer 226 and the second gate electrode 220B is arranged above the semiconductor layer 226 in the transistor 22 has been given by way of example, a configuration that the first and second gate electrodes are arranged in a vertically-inverted manner is also possible. That is, the pulse voltage (or the bias voltage) may be applied to either the upper electrode or the lower electrode in these two gate electrodes.

In addition, although, in the above-described embodiment, modification examples, and application example, only a case where, in the pulse voltage to be applied to the first gate electrode 220A and the bias voltage to be applied to the second gate electrode 220B, the voltage value of the bias voltage is corrected has been described, the voltage value to be corrected is not limited to the voltage value of the bias voltage. That is, only the voltage value of the pulse voltage may be corrected, or both of the voltage values of the pulse voltage and the bias voltage may be corrected. However, it may be rather desirable to correct the voltage value of the bias voltage because correction of the voltage value of the bias voltage is possible without complicating the circuit configurations of the row scanning section 13 and so forth as described above in the embodiment, the modification examples, and the application example.

Further, although, in the above-described embodiment, modification examples and application example, the image pickup unit 1 is configured such that the pulse voltage is applied to one (the first gate electrode 220A) of the two gate electrodes of the transistor 22 and the bias voltage is applied to the other (the second gate electrode 220B) thereof, the voltages to be applied to the respective gate electrodes are not limited to the above-described voltages.

In addition, the circuit configuration of the pixel in the image pickup section in any of the above-described embodiment, modification examples, and application example may be another circuit configuration, not limited to the circuit configurations (the circuit configurations of the pixels 20, and 20A to 20D) described in the above embodiment, modification examples, and application example. Likewise, the circuit configurations of the row scanning section, the column selection, section and so forth may be other circuit configurations, not limited to the configurations described in the above embodiment, modification examples, and application example.

In addition, the image pickup section, the row scanning section, the A/D conversion section (the column selection section), and the column scanning section, and so forth described in the above embodiment, modification examples, and application example may be configured to be formed on, for example, the same substrate. Specifically, it may become also possible to form the switches and so forth in the circuit portions of these components on the same substrate, for example, by using a polycrystalline semiconductor such as low temperature polycrystalline silicon. Therefore, it may become possible to perform the driving operations on the same substrate on the basis of, for example, a control signal from an external system control section, and it becomes possible to attain improvement in reliability when slimming down the bezel (a three-side-free bezel structure) and connecting wiring.

It is possible to achieve at least the following configurations from the above-described example embodiments and the modifications of the disclosure.

(1) An image pickup unit, including:
an image pickup section including a plurality of pixels, each of the plurality of pixels including a photoelectric conversion device and a field effect transistor;
a drive section configured to control a voltage to be applied to the transistor to perform reading-out driving of a signal charge accumulated in the pixel; and
a correction section configured to correct a voltage value used to drive the transistor,
the transistor including first and second gate electrodes arranged to face each other with a semiconductor layer interposed in between,
the drive section being configured to perform ON/OFF control of the transistor by applying a first voltage to the first gate electrode of the transistor and applying a second voltage to the second gate electrode of the transistor, and
the correction section being configured to correct a voltage value of one or both of the first and second voltages in accordance with a shift amount of a threshold voltage of the transistor.

(2) The image pickup unit according to the above-described (1), wherein the first voltage is a pulse voltage and the second voltage is a bias voltage.

(3) The image pickup unit according to the above-described (2), wherein the correction section corrects, at a predetermined timing, a voltage value of the second voltage in accordance with the shift amount of the threshold voltage.

(4) The image pickup unit according to any one of the above-described (1) to (3), wherein the image pickup section generates an electric signal based on incident radiation.

(5) The image pickup unit according to any one of the above-described (1) to (4), wherein the transistor includes a gate insulating film that includes a silicon oxide film.

(6) The image pickup unit according to any one of the above-described (1) to (5), wherein the semiconductor layer contains polycrystalline silicon, microcrystalline silicon, amorphous silicon, or an oxide semiconductor.

(7) The image pickup unit according to the above-described (6), wherein the semiconductor layer contains low-temperature polycrystalline silicon.

(8) The image pickup unit according to the above-described (3), wherein
the correction section samples pixel values corresponding to a plurality of respective voltage values while changing as the second voltage between the plurality of voltage values in a stepwise manner to apply the second voltage to the second gate electrode, in a non-exposure state, and the correction section calculates an optimum value of the second voltage in accordance with the shift amount of the threshold voltage based on the plurality of pixel values that have been sampled.

(9) The image pickup unit according to any one of the above-described (2), (3), and (8), wherein the pulse voltage includes an ON voltage and an OFF voltage, and the drive section holds the second gate electrode in a floating state during a period in which the ON voltage in the first voltage is being applied.

(10) The image pickup unit according to any one of the above-described (2), (3), and (8), wherein the pulse voltage includes an ON voltage and an OFF voltage, and the drive section applies a voltage that has same value as the ON voltage in the first voltage to the second gate electrode during a period in which the ON voltage in the first voltage is being applied.

(11) The image pickup unit according to the above-described (4), wherein the image pickup section includes a wavelength conversion layer on a light incident side of the photoelectric conversion device, the wavelength conversion layer being configured to convert the radiation into light having a wavelength in a sensitivity area of the photoelectric conversion device.

(12) The image pickup unit according to the above-described (4), wherein each of the plurality of pixels absorbs the radiation and converts the absorbed radiation into an electric signal.

(13) The image pickup unit according to any one of the above-described (4), (11), and (12), wherein the radiation is X rays.

(14) The image pickup unit according to any one of the above-described (1) to (13), wherein the photoelectric conversion device is configured of one of a PIN-type photodiode and an MIS-type sensor.

(15) An image pickup display system, including:
an image pickup unit; and
a display configured to perform image display based on an image pickup signal obtained by the image pickup unit,
the image pickup unit including
an image pickup section including a plurality of pixels, each of the plurality of pixels including a photoelectric conversion device and a field effect transistor,
a drive section configured to control a voltage to be applied to the transistor to perform reading-out driving of a signal charge accumulated in the pixel, and
a correction section configured to correct a voltage value used to drive the transistor,
the transistor including first and second gate electrodes arranged to face each other with a semiconductor layer interposed in between,
the drive section being configured to perform ON/OFF control of the transistor by applying a first voltage to the first gate electrode of the transistor and applying a second voltage to the second gate electrode of the transistor, and
the correction section being configured to correct a voltage value of one or both of the first and second voltages in accordance with a shift amount of a threshold voltage of the transistor.

It should be understood by those skilled in the art that various modifications, combinations, sub-combinations, and alterations may occur depending on design requirements and other factors insofar as they are within the scope of the appended claims or the equivalents thereof.

What is claimed is:

1. An image pickup unit, comprising:
an image pickup section including a plurality of pixels, each of the plurality of pixels including a photoelectric conversion device and a field effect transistor;
a drive section configured to control a voltage to be applied to the transistor to perform reading-out driving of a signal charge accumulated in the pixel; and
a correction section configured to correct a voltage value used to drive the transistor,
the transistor including first and second gate electrodes arranged to face each other with a semiconductor layer interposed in between,
the drive section being configured to perform ON/OFF control of the transistor by applying a first voltage to the first gate electrode of the transistor and applying a second voltage to the second gate electrode of the transistor, and
the correction section being configured to correct a voltage value of one or both of the first and second voltages in accordance with a shift amount of a threshold voltage of the transistor.

2. The image pickup unit according to claim 1, wherein the first voltage is a pulse voltage and the second voltage is a bias voltage.

3. The image pickup unit according to claim 2, wherein the correction section corrects, at a predetermined timing, a voltage value of the second voltage in accordance with the shift amount of the threshold voltage.

4. The image pickup unit according to claim 1, wherein the image pickup section generates an electric signal based on incident radiation.

5. The image pickup unit according to claim 1, wherein the transistor includes a gate insulating film that includes a silicon oxide film.

6. The image pickup unit according to claim 1, wherein the semiconductor layer contains polycrystalline silicon, microcrystalline silicon, amorphous silicon, or an oxide semiconductor.

7. The image pickup unit according to claim 6, wherein the semiconductor layer contains low-temperature polycrystalline silicon.

8. The image pickup unit according to claim 3, wherein
the correction section samples pixel values corresponding to a plurality of respective voltage values while changing as the second voltage between the plurality of voltage values in a stepwise manner to apply the second voltage to the second gate electrode, in a non-exposure state, and
the correction section calculates an optimum value of the second voltage in accordance with the shift amount of the threshold voltage based on the plurality of pixel values that have been sampled.

9. The image pickup unit according to claim 2, wherein
the pulse voltage includes an ON voltage and an OFF voltage, and
the drive section holds the second gate electrode in a floating state during a period in which the ON voltage in the first voltage is being applied.

10. The image pickup unit according to claim 2, wherein
the pulse voltage includes an ON voltage and an OFF voltage, and
the drive section applies a voltage that has same value as the ON voltage in the first voltage to the second gate electrode during a period in which the ON voltage in the first voltage is being applied.

11. The image pickup unit according to claim 4, wherein the image pickup section includes a wavelength conversion layer on a light incident side of the photoelectric conversion device, the wavelength conversion layer being configured to convert the radiation into light having a wavelength in a sensitivity area of the photoelectric conversion device.

12. The image pickup unit according to claim 4, wherein each of the plurality of pixels absorbs the radiation and converts the absorbed radiation into an electric signal.

13. The image pickup unit according to claim 4, wherein the radiation is X rays.

14. The image pickup unit according to claim 1, wherein the photoelectric conversion device is configured of one of a PIN-type photodiode and an MIS-type sensor.

15. An image pickup display system, comprising:

an image pickup unit; and a display configured to perform image display based on an image pickup signal obtained by the image pickup unit, the image pickup unit including an image pickup section including a plurality of pixels, each of the plurality of pixels including a photoelectric conversion device and a field effect transistor, a drive section configured to control a voltage to be applied to the transistor to perform reading-out driving of a signal charge accumulated in the pixel, and a correction section configured to correct a voltage value used to drive the transistor, the transistor including first and second gate electrodes arranged to face each other with a semiconductor layer interposed in between, the drive section being configured to perform ON/OFF control of the transistor by applying a first voltage to the first gate electrode of the transistor and applying a second voltage to the second gate electrode of the transistor, and the correction section being configured to correct a voltage value of one or both of the first and second voltages in accordance with a shift amount of a threshold voltage of the transistor.

* * * * *